United States Patent
Miki et al.

(10) Patent No.: US 7,256,437 B2
(45) Date of Patent: *Aug. 14, 2007

(54) SEMICONDUCTOR STORAGE DEVICE WHICH INCLUDES A HYDROGEN DIFFUSION INHIBITING LAYER

(75) Inventors: Hiroshi Miki, Shinjuku-ku (JP); Keiko Kushida, Kodaira (JP); Yasuhiro Shimamoto, Kokubunji (JP); Shinichiro Takatani, Koganei (JP); Yoshihisa Fujisaki, Fuchu (JP); Hiromi Nakai, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 260 days.

This patent is subject to a terminal disclaimer.

(21) Appl. No.: 10/920,344

(22) Filed: Aug. 18, 2004

(65) Prior Publication Data
US 2005/0051821 A1    Mar. 10, 2005

Related U.S. Application Data

(60) Continuation of application No. 10/602,644, filed on Jun. 25, 2003, now Pat. No. 6,818,523, which is a division of application No. 10/026,615, filed on Dec. 27, 2001, now Pat. No. 6,635,913, which is a continuation of application No. 09/341,523, filed on Aug. 13, 1999, now Pat. No. 6,342,712.

(51) Int. Cl.
*H01L 29/76* (2006.01)

(52) U.S. Cl. .................. 257/295; 257/296; 257/297; 257/303; 257/310

(58) Field of Classification Search .......... 257/295–297, 257/303–310; 438/652–653, 396
See application file for complete search history.

(56) References Cited

U.S. PATENT DOCUMENTS

| 5,005,102 A | 4/1991 | Larson |
| 5,396,095 A | 3/1995 | Wolters et al. |
| 5,622,893 A | 4/1997 | Summerfelt et al. |
| 5,780,351 A | 7/1998 | Arita et al. |
| 6,342,712 B1 | 1/2002 | Miki et al. |
| 6,355,952 B1 * | 3/2002 | Yamoto et al. ............. 257/295 |

FOREIGN PATENT DOCUMENTS

| EP | 513894 | 11/1992 |
| EP | 642167 | 3/1995 |
| JP | 4-367211 | 12/1992 |
| JP | 7-111318 | 4/1995 |
| JP | 7-302888 | 11/1995 |
| JP | 9-97883 | 4/1997 |
| JP | 11-224934 | 8/1999 |
| WO | PCT/JP98/00027 | 1/1998 |

* cited by examiner

*Primary Examiner*—Dung A. Le
(74) *Attorney, Agent, or Firm*—Antonelli, Terry, Stout & Kraus, LLP.

(57) ABSTRACT

The upper electrode of a capacitor is constituted of laminated films which act to prevent hydrogen atoms from reaching the capacitor electrodes and degrading performance. In one example, a four layer upper electrode respectively acts as a Schottky barrier layer, a hydrogen diffusion preventing layer, a reaction preventing layer, and an adsorption inhibiting layer. Therefore, the occurrence of a capacitance drop, imperfect insulation, and electrode peeling in the semiconductor device due to a reducing atmosphere can be prevented. In addition, the long-term reliability of the device can be improved.

21 Claims, 21 Drawing Sheets

SEMICONDUCTOR STORAGE DEVICE WHICH INCLUDES A HYDROGEN DIFFUSION INHIBITING LAYER

CROSS-REFERENCE TO RELATED APPLICATIONS

This application is a Continuation of application Ser. No. 10/602,644, filed Jun. 25, 2003, now U.S. Pat. No. 6,818,523 which is a Divisional of application Ser. No. 10/026,615, filed Dec. 27, 2001 (now U.S. Pat. No. 6,635,913), which is a Continuation of application Ser. No. 09/341,523, filed Aug. 13, 1999 (now U.S. Pat. No. 6,342,712) and wherein application Ser. No. 09/341,532 is a national stage application filed under 35 USC § 371 of International Application No. PCT/JP98/00027, filed Jan. 8, 1998, the entire disclosures of which are hereby incorporated by reference.

TECHNICAL FIELD

The present invention relates to a semiconductor storage device and, more particularly, a semiconductor storage device having a capacitor using a high dielectric constant or ferroelectric film.

BACKGROUND ART

A conventional capacitor using a dielectric having a dielectric constant higher than that of a silicon oxide film or a ferroelectric having a dielectric constant higher than that of a silicon nitride film has a large capacitance per unit area. Applications require large capacitance with small area, particularly applications such as large-scaled DRAMs have been being examined. In such structures, the dielectric having a high dielectric constant is defined as a material having a dielectric constant higher than that of the silicon oxide film. Ferroelectric materials have a spontaneous polarization which can be inverted by an electric field. In particular, as ferroelectrics, complex-metal oxides such as (Ba, Sr)TiO$_3$ (hereinbelow, BST) and Pb(Zr, Ti)O$_3$ (hereinbelow, PZT) are being examined. In order to suppress degradation of the oxides upon film formation, a noble metal such as platinum having oxidation resistance is typically used as a lower electrode. Meanwhile, since an upper electrode is generally formed after film formation, in order to avoid reaction with the dielectric having a high dielectric constant in a heat treatment process after formation of a capacitor, the upper electrode is generally made of platinum.

For example, according to U.S. Pat. No. 5,005,102, a lower electrode has a structure of platinum/titanium nitride/titanium and an upper electrode has a structure of aluminum/titanium/platinum. In particular, with respect to the upper electrode, it is described that aluminum serves as an electrical contact layer, titanium serves as a diffusion barrier layer, and platinum serves as a plate layer.

In the case of fabricating a memory using those elements, after forming a capacitor, a wiring layer for electrically connecting to the capacitor and a wiring layer related to a peripheral circuit part for performing electrical conversion between a memory cell and the outside of the memory chip are formed. In order to obtain electrical insulation between the wiring layers and between the wiring layers and the capacitor, it is necessary to form interlayer insulating films. This process is performed in a reducing or weak acidic atmosphere in order to prevent degradation of the wiring layers. Since a through hole for electrically connecting the peripheral circuit and the wiring layers generally has a shape with a high aspect ratio, which is deep as compared with the size of the opening, tungsten or the like is deposited by a CVD process. The atmosphere at this time is a reducing one. It is known that the capacitor is seriously damaged by being subjected to the treatment in the reducing atmosphere. For example, according to "Material Research Society Symposium Proceedings", Vol. 310, pp. 151 to 156, 1993, it is reported that by forming an SiO$_2$ film by a CVD process, PZT as a ferroelectric loses its ferroelectricity characteristics and a leakage current increases.

Further, although the characteristics of a semiconductor active device degrade due to a heat treatment in a capacitor fabricating process, a plasma process in a wiring process, and the like, by additionally performing a heat treatment in hydrogen at approximately 400 degrees after completion of the wiring process, the degradation can subsequently be repaired. Consequently, a hydrogen treatment is generally performed after completion of the wiring process. It is known, however, that the hydrogen treatment exerts an influence on the characteristics of the capacitor in a manner similar to the interlayer insulating film process. For instance, according to "8th International Symposium on Integrated Ferroelectrics, 11c", 1996, it is reported that, in the case where SrBi$_2$Ta$_2$O$_9$ (hereinbelow, SBT) is used as a ferroelectric, the capacitor is peeled off or, when the capacitor is not peeled off, a leakage current characteristic largely deteriorates.

The dielectric having a high dielectric constant and the ferroelectric will be generically called a high dielectric constant or ferroelectric film hereinbelow.

It is an object of the invention to obtain a very reliable semiconductor storage device in which the high dielectric constant or ferroelectric film is prevented from degrading.

SUMMARY OF THE INVENTION

The object is achieved by providing a capacitor electrode with a film which reduces an amount of hydrogen molecules reaching the capacitor electrode to $10^{13}$/cm$^2$ or smaller. It is preferable to use a film by which the hydrogen molecules become $10^{12}$/cm$^2$ or smaller.

As a result of examination of the cause of degradation in a treatment using hydrogen, we have found that using platinum as an electrode is related to a degradation process. Specifically, the following mechanism was uncovered. When platinum is used as an electrode, hydrogen molecules are decomposed by the platinum, active hydrogen such as hydrogen atoms and hydrogen radicals are generated, and the active hydrogen is promptly diffused in platinum, thereby degrading the high dielectric constant or ferroelectric film.

It was also found out that, because of the existence of the mechanism, the capacitor characteristics degrade or an electrode is peeled off even at a low temperature such as 300° C. At such a temperature, it has not previously been expected that the high dielectric constant or ferroelectric is reduced and degraded.

By providing a film which prevents hydrogen molecules from reaching the electrode as much as possible, the high dielectric constant or ferroelectric film can be prevented from degrading.

To be specific, it is sufficient to provide a film whose adsorption of the hydrogen molecules is $10^{13}$/cm$^2$ or smaller, preferably, $10^{12}$/cm$^2$ or smaller. By providing such a film which substantially does not adsorb hydrogen (hereinbelow, called an "adsorption inhibiting layer"), the amount of hydrogen molecules reaching a platinum film as a part of the capacitor electrode is decreased and, as a result, the amount of active hydrogen can be reduced. Thus, degradation and peeling in the wiring forming process of the high dielectric constant or ferroelectric capacitor are suppressed and improvement in the long-term reliability is realized. As a material of the film, silver, aluminum, silicon, lead, bismuth, gold, zinc, cadmium, indium, germanium, and tin are effective. Since the surface of each of these materials has an atomic arrangement which prevents the adsorption of hydrogen, it is effective in preventing the adsorption. As described above, by providing a layer which does not adsorb hydrogen much as compared with platinum, an effect on suppression of generation of the active hydrogen is produced. In the case where only an aluminum film is used, since the adsorption of hydrogen is relatively good, it is preferable to further provide a diffusion preventing layer which will be described hereinbelow. When the films are formed so as to be in contact with the platinum electrode, mutual diffusion occurs. It is therefore preferable to provide a reaction preventing layer such as a titanium nitride film or a tungsten nitride film therebetween.

A film in which the diffusion of hydrogen molecules is $10^{13}/cm^2$ or smaller, preferably, $10^{12}/cm^2$ or smaller may be provided. By providing a film which substantially prevents the diffusion of the hydrogen molecules (hereinbelow, called a "hydrogen diffusion preventing layer"), the diffusion amount of the hydrogen molecules becomes extremely small, the amount of hydrogen molecules reaching the capacitor electrode is decreased, and the amount of active hydrogen generated by the action of the capacitor electrode can be reduced. As a hydrogen diffusion preventing layer, specifically, besides tungsten, a conductive oxide such as ruthenium oxide, iridium oxide, palladium oxide, osmium oxide, or platinum oxide, ruthenium, iridium, palladium, osmium, or an oxide of an alloy of any of these materials can be mentioned. In the case where the capacitor electrode is made of any of these materials without providing the adsorption inhibiting layer, since the reaction between any of the materials and the platinum electrode does not occur to a large extent, it is unnecessary to provide a reaction preventing layer.

Further, when the capacitor electrode is provided with a stack of the adsorption inhibiting layer and the hydrogen diffusion preventing layer, the amount of hydrogen molecules reaching the capacitor electrode is further reduced, so that it is more effective. In this case, it is sufficient that an amount of hydrogen of $10^{12}/cm^2$ or less reaches the electrode through both of the adsorption inhibiting layer and the hydrogen diffusion preventing layer. In the case where the layers are stacked and one of the adsorption inhibiting layer and the hydrogen diffusion preventing layer is made of an oxide, in order to prevent the reaction between the layers, it is preferable to provide a reaction preventing layer between them. When both of the layers are made of oxides, it is unnecessary to provide the reaction preventing layer.

The reaction preventing layer may be made of titanium, a titanium alloy, or a titanium nitride. Besides them, any of tungsten, tantalum, molybdenum, nitrides of these materials, and the like can be used as a hydrogen diffusion preventing layer and reaction preventing layer.

When the total thickness of the capacitor electrode, the hydrogen diffusion preventing layer, and the adsorption inhibiting layer is 20 nm or more, a beneficial effect to a certain extent can be expected. When the thickness exceeds 0.5 µm, it becomes difficult to form the structure. Consequently, it is preferable that the film thickness lies in a range from 20 nm to 0.5 µm.

The material of the capacitor electrode is not limited to platinum but may be ruthenium, iridium, palladium, nickel, osmium, rhenium, or a material whose main component is a conductive material of an oxide of any of these materials.

Although sufficient effects can be obtained when the hydrogen diffusion preventing layer and the adsorption inhibiting layer are formed in the upper part of the capacitor electrode, it is more effective when the layers are formed not only in the upper part but also on the sides. Further, when they are formed under the capacitor electrode, it is effective in preventing invasion of the hydrogen molecules diffused from the wafer substrate side into the capacitor electrode. A specific description will be given hereinbelow.

A capacitor and a semiconductor active device are provided and the hydrogen diffusion preventing layer is interposed between the capacitor and the semiconductor active device. It is more preferable that a hydrogen adsorption preventing layer is disposed on the capacitor. In the capacitor, two electrodes may be arranged vertically or horizontally. When the two electrodes are arranged vertically, the hydrogen adsorption inhibiting layer may construct a part of the upper one of the two electrodes.

It is preferable that a part of the hydrogen diffusion preventing layer constructs a part of a connection plug which electrically connects one of the two electrodes to the semiconductor active device.

Further, it is preferable that a part of the hydrogen diffusion preventing layer constructs a part of an interlayer insulating film interposed between the capacitor and the semiconductor active device. In this case, preferably, the hydrogen diffusion preventing layer is an oxide insulator. As such a material, for example, a material having the main component of an aluminum oxide or a cerium oxide can be used. The aluminum oxide or cerium oxide can be used by being contained in $SiO_2$ typically used for the insulating layer. When the aluminum oxide or the cerium oxide has 5 weight % or more, a certain extent of the desired effect is produced. When it is 10 weight % or more, more of the desired effect is realized. The upper limit of the value of the aluminum oxide is regulated from the viewpoint of the workability. The upper limit of the value of the cerium oxide is regulated from the viewpoint of the insulation performance.

Further, according to the semiconductor device of the invention, it is preferable that a second semiconductor active device is provided in an area which is different from the area where the capacitor is disposed and the hydrogen diffusion preventing layer is not formed on the second semiconductor active device.

As a result of the above-noted features, detective insulation and peeling of the electrode caused by a treatment in a reducing atmosphere, such as metal film CVD, and a treatment using hydrogen, such as an interlayer insulating film forming process, can be prevented and the long-term reliability can be improved.

DETACHED DESCRIPTION OF THE INVENTION

Embodiment 1

Figure 1:
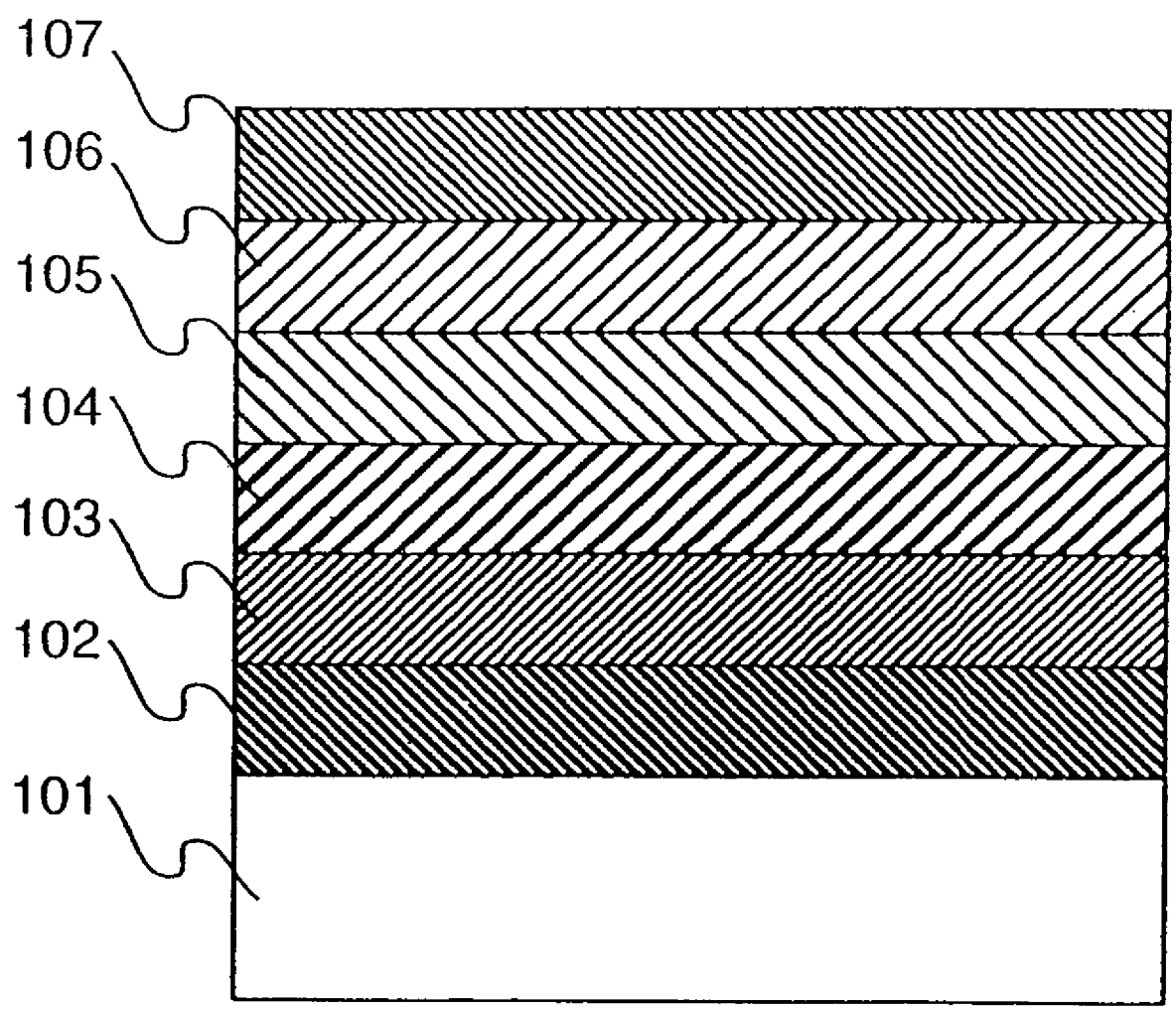
FIG. 1 is a cross section of a capacitor according to an embodiment of the invention.

A preferred embodiment of the invention will be described hereinbelow with reference to FIG. 1.

In a capacitor of the invention, a lower electrode (102) and a high dielectric constant or ferroelectric thin film (103) are formed by a known method on either a device layer or a semiconductor area (101) constructing, for example, a transistor, which is formed by a known method. On the film (103), an upper layered electrode consisting of four layers of the invention is formed. That is, the upper layered electrode consists of a Schottky barrier layer (104), a hydrogen diffusion preventing layer (105), a reaction preventing layer (106), and an adsorption inhibiting layer (107).

Although the upper layered electrode is comprised of four can be realized by a plurality of layers, so that the number of stacked layers may increase or decrease. All of those element, although the invention is not limited to this.

The functions of the layers will now be described. The Schottky barrier layer (104) serves as a Schottky barrier by being in contact with the high dielectric constant or ferroelectric layer. The layer serves as the interface between the ferroelectric film and the electrode to make an electron conduction band discontinuous. A leakage current of the capacitor is reduced by the barrier, so that information holding characteristics necessary for the operation of the semiconductor storage device can be obtained. The component elements of the Schottky barrier layer (103) should not be diffused in the high dielectric constant or ferroelectric layer or the Schottky barrier layer (103) should not absorb the component elements of the high dielectric constant or ferroelectric layer by the heat treatment after formation of the capacitor, and the discontinuous band has to be big enough for the operation of the semiconductor storage device. The hydrogen diffusion preventing layer (105) formed after that has the function of effectively reducing the concentration of hydrogen reaching the Schottky barrier layer by suppressing the diffusion of hydrogen which is diffused from the upper part.

The adsorption inhibiting layer (107) which is formed on the hydrogen diffusion preventing layer (105), preferably via the reaction preventing layer (106), is a layer for checking the hydrogen in a gaseous phase. Platinum is usually used for the upper electrode of the high dielectric constant or ferroelectric capacitor. It is known that platinum has the function of adsorbing and decomposing hydrogen. The hydrogen, once decomposed, is easily diffused in a metal, reaches the high dielectric constant or ferroelectric layer, and presents a high reduction performance, so that the capacitor critically deteriorates even at a low temperature such as 30° C. The adsorption inhibiting layer (107) used here does not adsorb hydrogen and accordingly has no effect on dissociation of hydrogen, so that the probability of injection of hydrogen into the high dielectric constant or ferroelectric layer is reduced.

Figure 2:
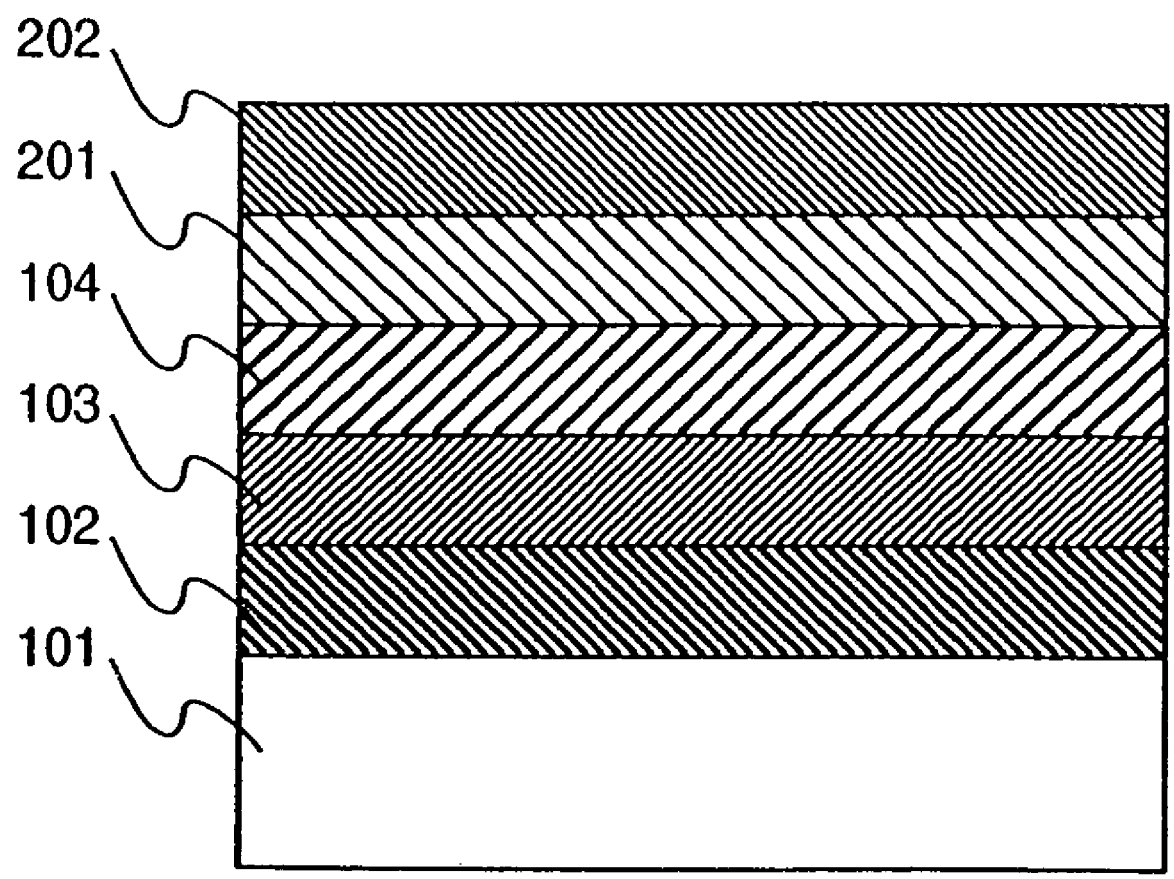
FIG. 2 is a cross section of a capacitor according to a prior art.

As shown in FIG. 2, a conventional capacitor comprises an aluminum (202) as an electrical contact layer, titanium (201) as a reaction preventing layer, and platinum as a plate layer and does not produce an effect on suppressing the diffusion of hydrogen. Although it is known that the aluminum (202) has the function of preventing the adsorption of hydrogen, a sufficient effect cannot be obtained as will be described hereinlater.

Embodiment 2

A method of fabricating the layered upper electrode will now be described more specifically.

Figure 3:
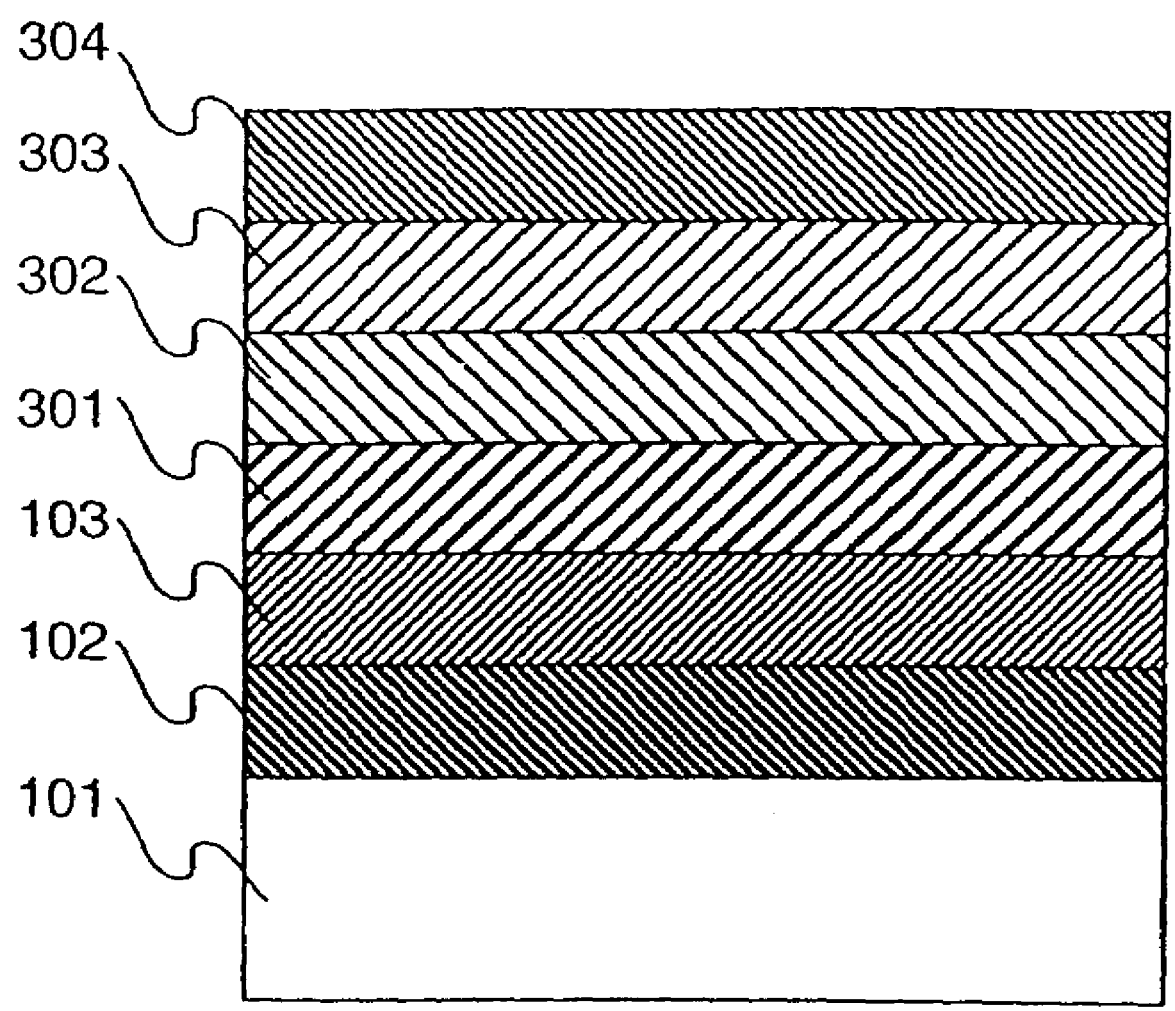
FIG. 3 is a cross section of a capacitor according to another preferred embodiment of the invention.

FIG. 3 shows a preferred embodiment of a capacitor according to the invention. On an active device layer (101) including a transistor formed by a known method, platinum (102) is deposited to 100 nm as a lower electrode by DC sputtering. Subsequently, PZT is deposited to 50 nm by radio frequency sputtering. After that, a heat treatment at 650° C. is performed in oxygen, thereby forming the high dielectric constant or ferroelectric layer (103). 50 nm of platinum (301) is then formed as a Schottky barrier layer. Subsequently, 100 nm of tungsten (302) as a diffusion barrier layer, 50 nm of titanium nitride (303) as a reaction preventing layer, and 100 nm of silver (304) as an adsorption inhibiting layer are formed, thereby obtaining a layered upper electrode.

Figure 4:
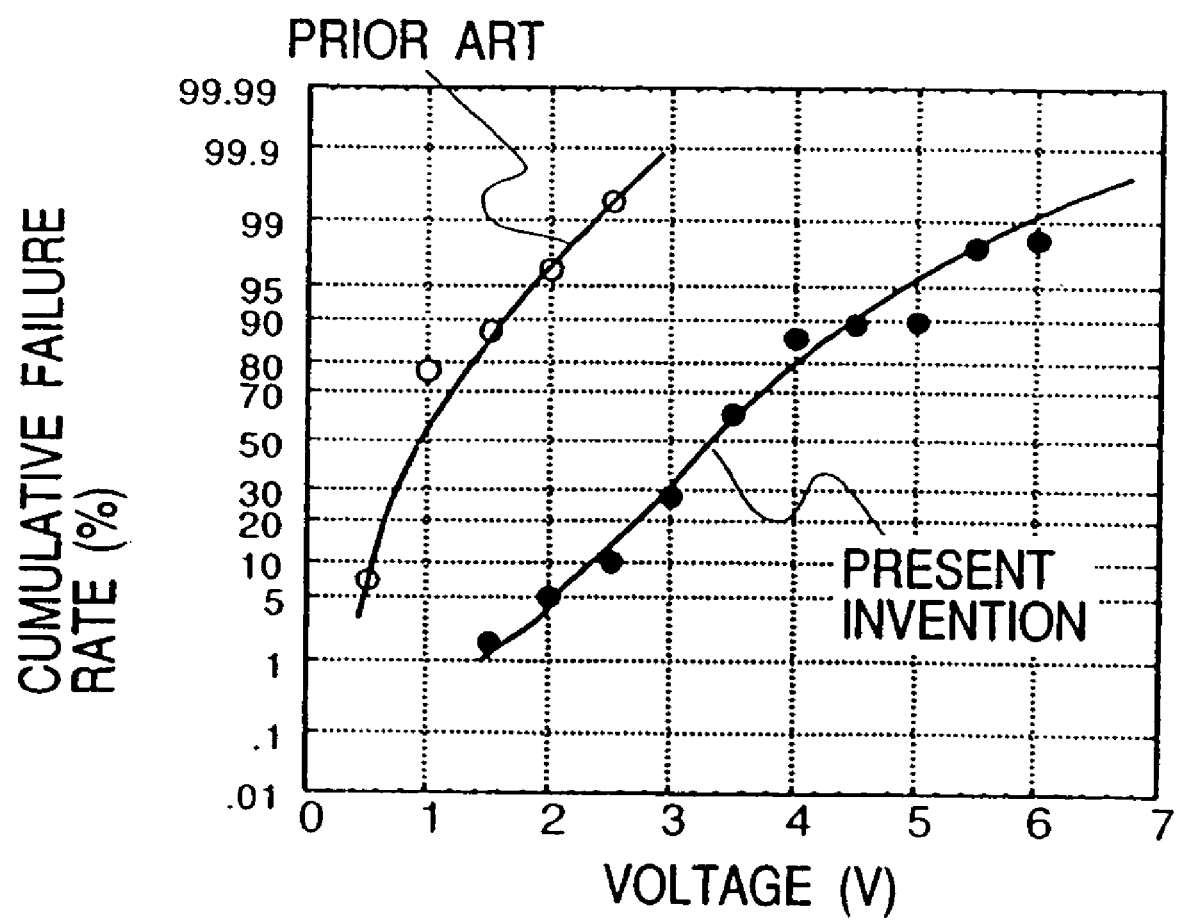
FIG. 4 is a characteristic diagram showing the ratio of electrical breakdown of the capacitor of the invention and that of the prior art.
Figure 5:
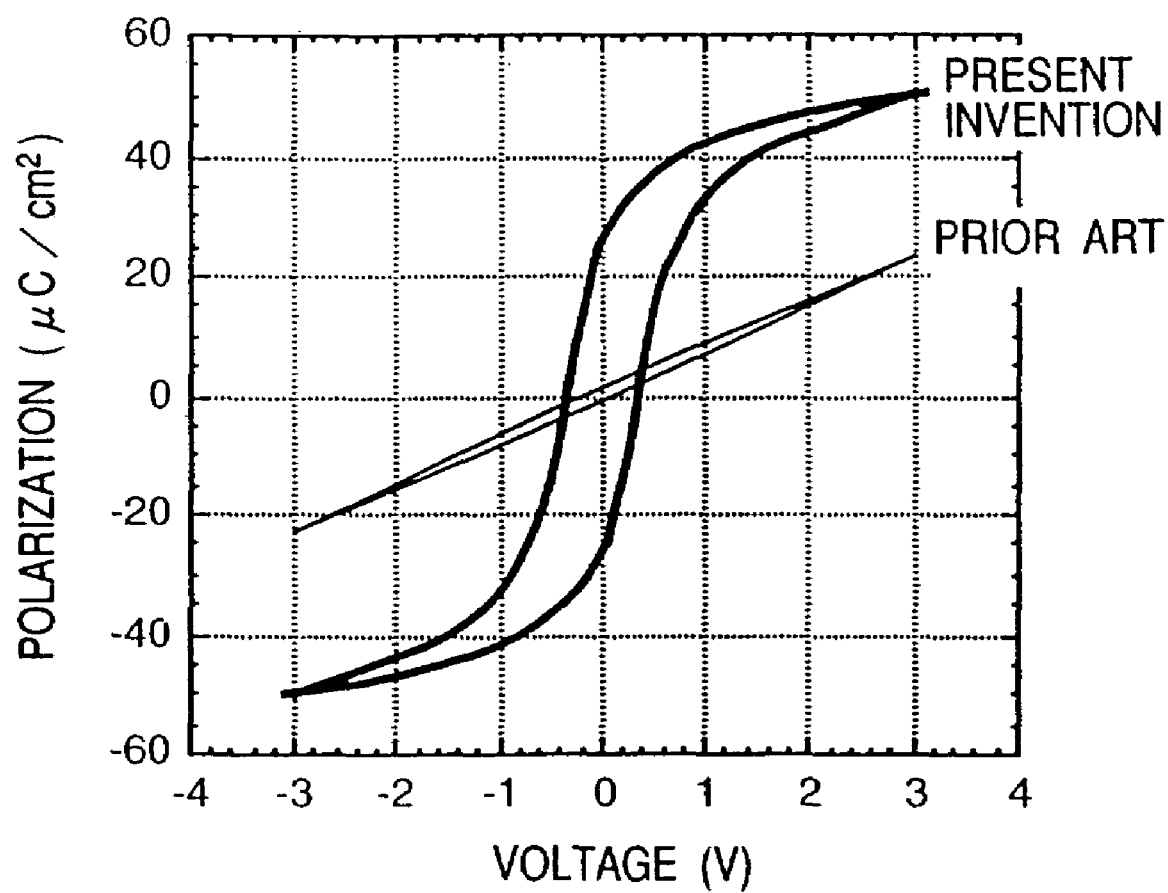
FIG. 5 is a polarization—voltage characteristic diagram of the capacitor of the invention and that of the prior art.

The electrical breakdown voltage distribution after the heat treatment in hydrogen of the capacitor having this structure is shown in FIG. 4. The capacitor is compared with the prior art of FIG. 2 with respect to a case where a treatment is performed at 350° C. for thirty minutes. In the conventional upper electrode structure, most of capacitors show defective insulation at 1V to 2V and cannot be applied to a DRAM. It was found that the capacitor of the invention can practically withstand in the region up to 1V of an application voltage. The polarization—field characteristics are shown in FIG. 5. Similarly, the hydrogen treatment was performed at 350° C. for thirty minutes. Although the hysteresis characteristic of the polarization—field characteristic is lost in the prior art, the characteristic can be held in the present invention. The upper electrode of the capacitor according to the prior art was peeled off in the hydrogen treatment at 400° C. In contrast, according to the invention, there was no peeling and only a small degree of degradation occurred in the electrical breakdown voltage and the dielectric characteristic.

Embodiment 3

Another preferred embodiment of the invention will be described with reference to FIG. 6. On the active device layer (101) including a transistor formed by a known method, platinum (102) is deposited to 100 nm as a lower electrode by DC sputtering. Then, on the substrate heated to 500° C., BST is deposited to 50 nm by radio frequency sputtering. After that, a heat treatment at 650° C. is performed in oxygen, thereby forming a high dielectric layer (601). Subsequently, platinum (301) is deposited to 50 nm as a Schottky barrier layer. In the embodiment, ruthenium oxide (602) is deposited to 50 nm as a hydrogen diffusion preventing layer by reactive sputtering using oxygen. On the layer (602), a layered film (603) of 50 nm of metal ruthenium and 50 nm of titanium nitride is formed in this order as a reaction preventing layer by sputtering. On the layer (603), aluminum (604) is deposited to 100 nm as an adsorption inhibiting layer, thereby obtaining a layered upper electrode.

Figure 6:
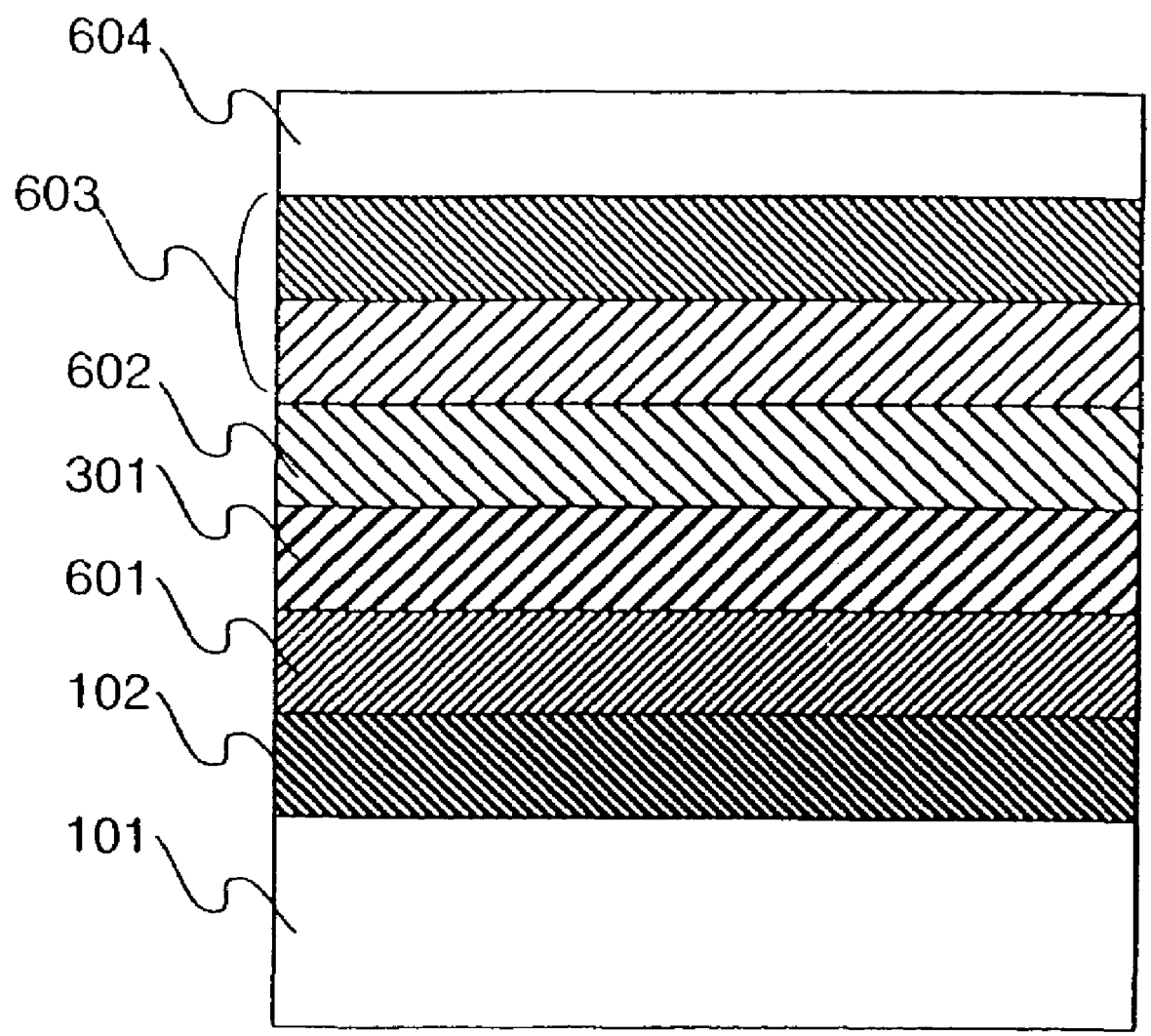
FIG. 6 is a cross section of a capacitor according to another preferred embodiment of the invention.
Figure 7:
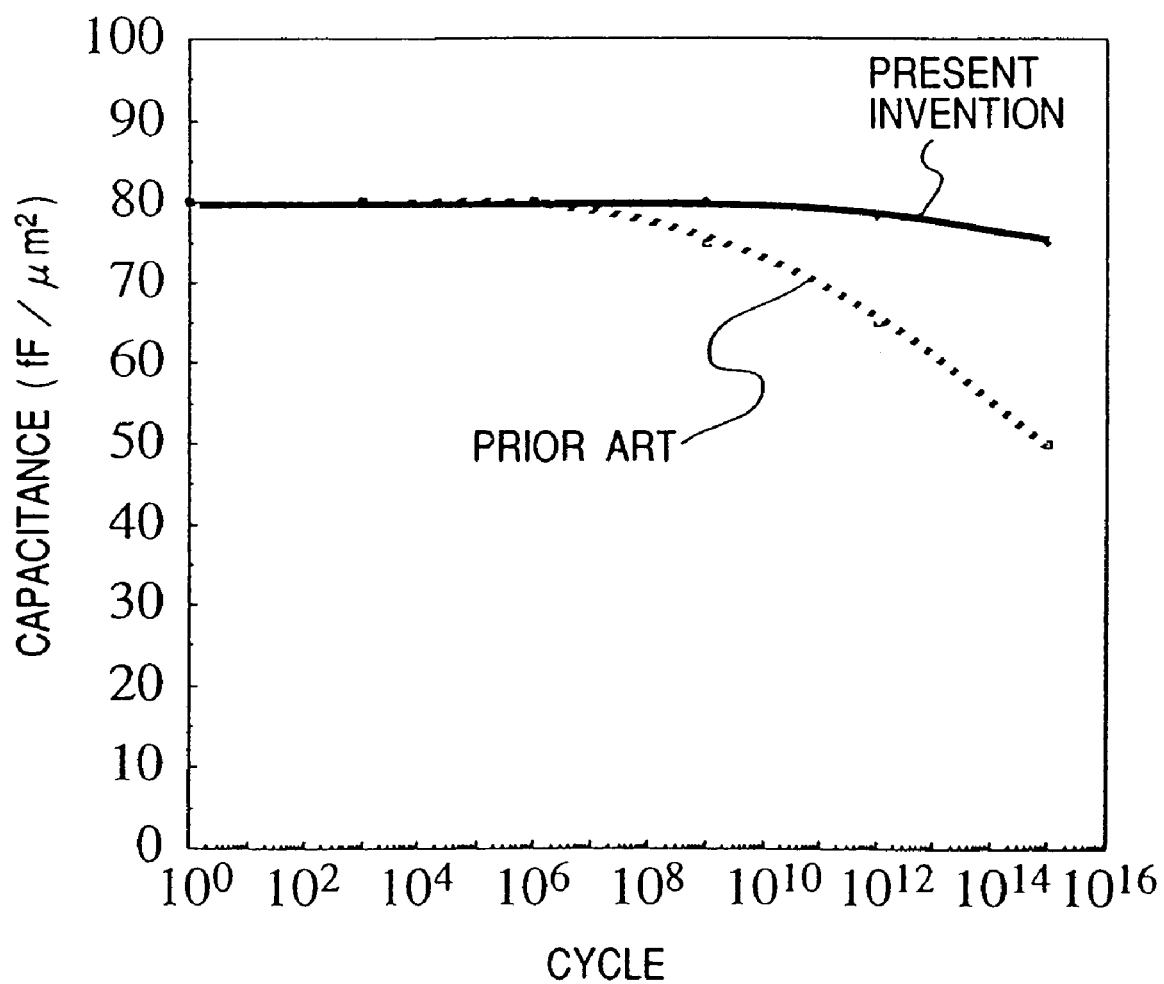
FIG. 7 is a characteristic diagram showing the comparison of degradation of the capacitance due to an alternating electric field stress between the capacitor of the invention and that of the prior art.

The capacitor having the structure of FIG. 6 is subjected to the hydrogen treatment and the change with time in capacitance was examined by applying an alternating electric field (FIG. 7). The hydrogen treatment was performed at 400° C. for thirty minutes. Although there was no change in the initial capacitance also in the prior art shown in FIG. 2 for comparison, the degradation due to the alternating electric field was severe and the reliability necessary for the semiconductor storage device could not be assured. It was found that, according to the invention, the capacitance deteriorates only slightly and the reliability can be assured.

Other preferred materials and fabrication methods of the layered upper electrode of the invention will now be described. Although the Schottky barrier layer is made of platinum in the above examples, a material containing any of ruthenium, iridium, palladium, nickel, and platinum as the main component is suitable. As the hydrogen diffusion preventing layer, besides tungsten and ruthenium oxides, a conductive oxide, preferably, iridium oxide or palladium oxide can be applied. As the reaction preventing layer, besides titanium nitride, titanium or a titanium alloy is applicable. A metal selected from tungsten, tantalum, and molybdenum or a nitride of any of the metals can be used as a hydrogen diffusion preventing layer and the reaction preventing layer. In the case where the conductive oxide is used as the hydrogen diffusion preventing layer, it is necessary to use a layer made of, as the main component, a metal which makes an oxide conductive as a barrier layer against oxygen in the conductive oxide. Preferably, platinum, iridium, ruthenium, or palladium is used.

Figure 8:
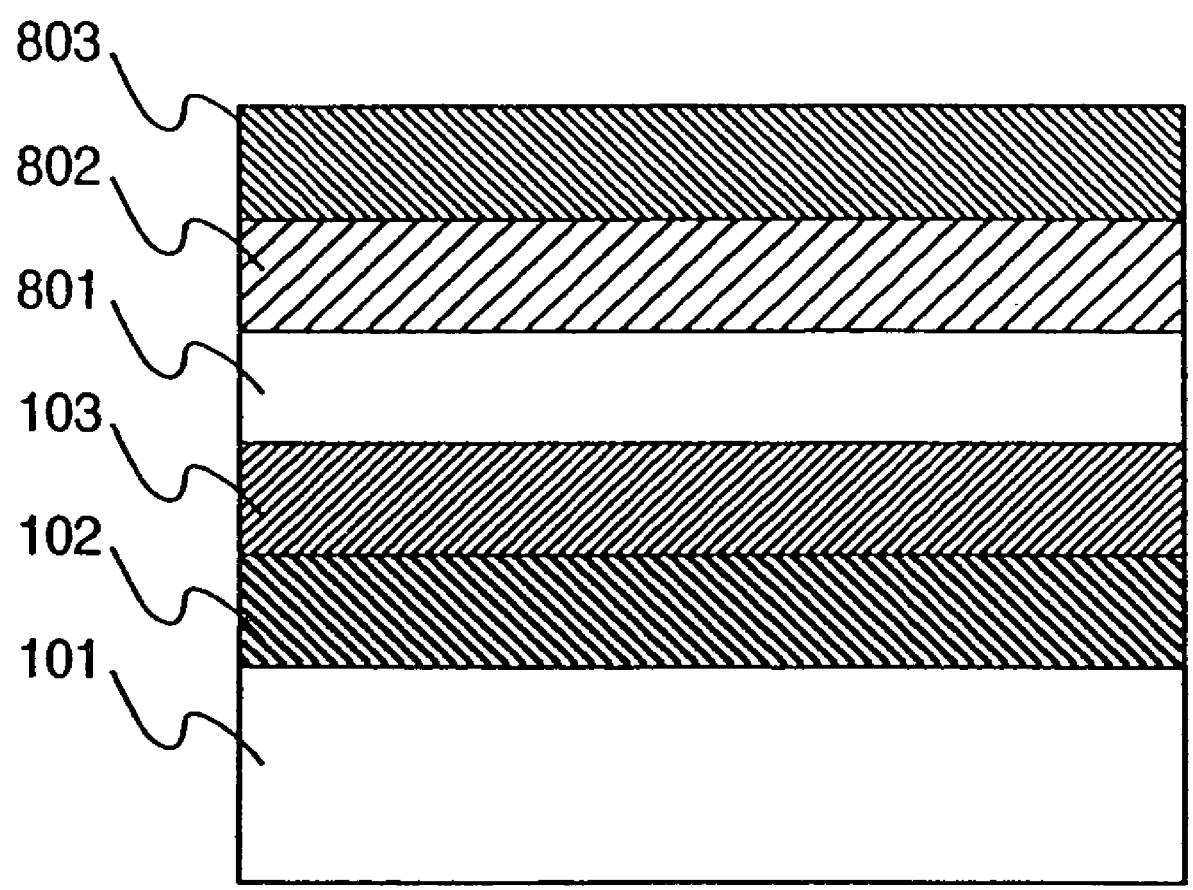
FIG. 8 is a characteristic diagram showing the difference in effects depending on material selection of the invention.

Although silver and aluminum were mentioned as examples as the hydrogen adsorption inhibiting layer, a conductor containing silver, aluminum, silicon, lead, or bismuth as the main component is suitable. The action, however, largely varies according to the materials. FIG. 8 illustrates a case using silver and aluminum as an adsorption inhibiting Examples of the semiconductor storage devices having layer for comparison of a change in the switching charge amount of PZT by hydrogen annealing. A case of using, not the layered film, but only the Schottky barrier layer made of platinum is shown for comparison. The effect of the case using aluminum is smaller as compared with silver. It is understood that damage caused by hydrogen cannot be suppressed by the conventional structure shown in FIG. 2.

Although BST and PZT have been mentioned above as examples of the high dielectric constant or ferroelectric material, high electric constant or ferroelectric materials of oxides each having, as the main component, an element selected from barium, lead, strontium, and bismuth are effective. Preferable materials except for BST and PZT are strontium titanate ($SrTiO_3$), lead titanate ($PbTiO_3$), barium lead zirconate titanate ($(Ba, Pb)(Zr, Ti)O_3$), barium lead niobate ($(Ba, Pb)Nb_2O_6$), strontium bismuth tantalate ($SrBi_2Ta_2O_9$), and bismuth titanate ($Bi_4Ti_3O_{12}$).

Embodiment 4

Examples of the semiconductor storage devices having the capacitors will now be described.

Figure 9:
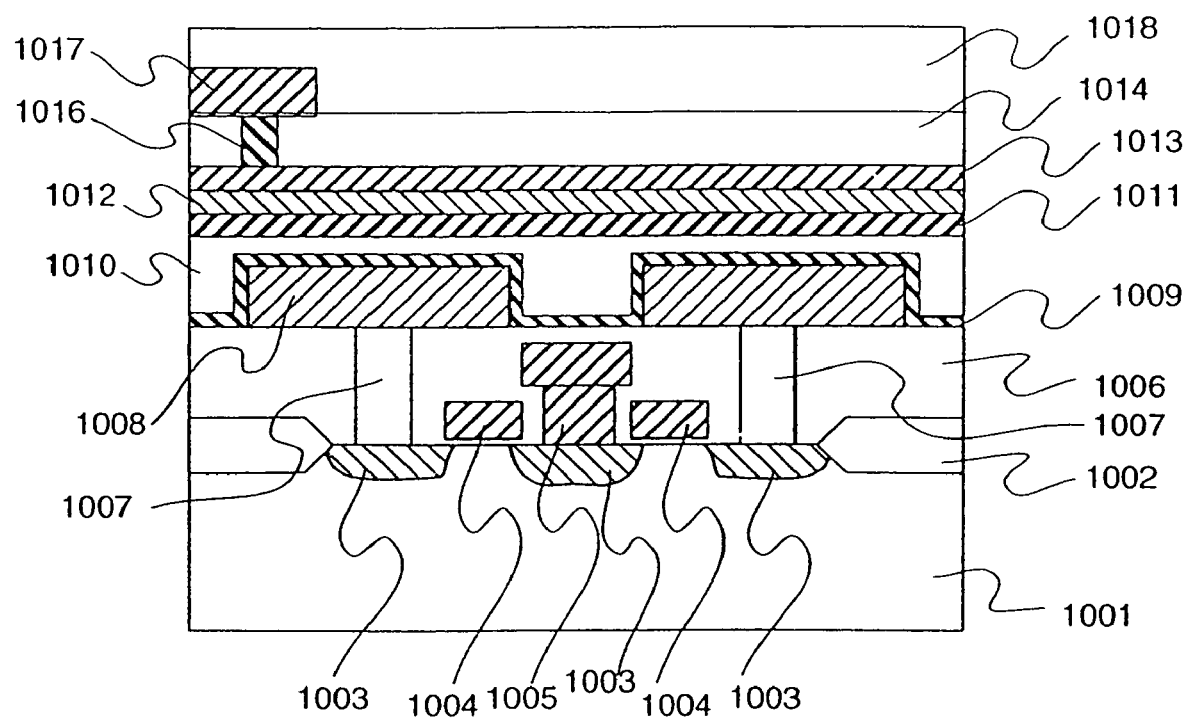
FIG. 9 is a partial cross section of a DRAM according to the invention.

FIG. 9 relates to an example of a DRAM using BST as a high dielectric constant or ferroelectric layer. On an Si substrate (1001), device layers including transistors are formed by a known process. Specifically, an isolation film (1002), a conductive impurity diffusion layer (1003), a polysilicon transistor gate electrode (1004), a polysilicon wiring (1005), and an interlayer insulating film (1006) are formed. A conductive plug (1007) for obtaining electric connection between the capacitor and transistor is formed. Preferably, the material of the conductive plug (1007) is either a titanium nitride/titanium suicide stacked layer or a titanium nitride/polysilicon stacked layer formed by CVD. Subsequently, platinum is deposited to 100 nm by DC sputtering and, after that, the platinum is processed by argon sputtering with a mask pattern formed by known photolithography, thereby forming a platinum lower electrode (1008). Then, a BST film (1009) is formed by, preferably, CVD for performing thermal decomposition in oxygen by using an alcoholate or complex of barium, strontium, or titanium. More preferably, CVD using di-pyvaroyle methanate barium ($Ba(DPM)_2$), di-pyvaroyle methanate strontium ($Sr(DPM)_2$), and titanium isopropoxide ($Ti(i-OC_3H_7)_4$) is effective. These materials are charged in a heat insulating vessel. $Ba(DPM)_2$ and $Sr(DPM)_2$ are heated to 150° C. to 250° C. and $Ti(i-OC_3H_7)_4$ is heated to 30° C. to 60° C. so as to have a proper steam pressure. The materials are transported into a reaction chamber by argon bubbling. With oxygen simultaneously supplied to the reaction chamber, the materials are thermally decomposed and oxidized on a substrate heated to 400° C. to 700° C. The thickness of the BST film is set to 20 nm. Platinum is deposited to 100 nm by sputtering as a Schottky barrier layer (1010). In this case, depending on the aspect ratio of a trench between the lower electrodes, sputtering and etch back so as to direct platinum particles or formation of ruthenium by CVD is necessary. As a part of the hydrogen diffusion preventing layer and the reaction preventing layer, an iridium/iridium oxide stacked film (1011) is formed. In this case, a stacked film of iridium oxide is formed by reactive sputtering by mixing with oxygen and metal iridium by typical argon sputtering. Subsequently, titanium nitride (1012) is deposited to 50 nm as a reaction preventing layer by reactive sputtering by mixing with nitrogen. Finally, as a hydrogen adsorption inhibiting layer, silver (1013) is deposited to 20 nm by sputtering, thereby forming the layered upper electrode for capacitor according to the invention. As shown in FIG. 9, in the structure of the upper electrode according to the invention, it does not have to be divided into information bits. The structure such that the capacitor is covered with the upper electrode for a plurality of bits can be realized. The covered structure shown in the diagram is more effective. With the structure, even in the case of the upper electrode having a complicated layered structure, application of micro processing with a processing accuracy which is not strict can be realized irrespective of the minimum processing dimension of a product of the generation such as a control gate of a transistor.

A wiring process after formation of the capacitor will now be described. An interlayer insulating film (1014) having the thickness of 200 nm is formed by known plasma CVD using tetra ethyloxy silane (TEOS). An electrical contact hole (1016) is opened by dry etching. A connection plug is inserted into the contact hole (1016) by known hydrogen reducing blanket tungsten CVD. In this case, deposition is performed for about thirty seconds by using tungsten hexafluoride and hydrogen with the substrate temperature of 400° C. and the pressure of 0.5 Torr. In the case of the known upper electrode structure, namely, the layered electrode of aluminum, titanium nitride, and platinum, degradation occurs in the electrical breakdown voltage by the CVD in a manner similar to FIG. 4. After formation of the tungsten connection plug, a planarization process is performed and, further, a layered wiring (1017) of titanium nitride and aluminum is formed. An interlayer insulating film (1018) is then formed so as to cover the layered wiring (1017). In the case of further providing a wiring layer as well, the above-mentioned wiring process after completion of formation of the capacitor can be applied. The electrical breakdown voltage of the capacitor deteriorated severely in the electrode having the conventional structure also in the case where the hydrogen heat treatment after completion of the wiring process was performed at 400° C. for thirty minutes. On the contrary, according to the invention, the characteristics after formation of the layered upper electrode could be maintained. The final capacitance of the capacitor was 90 fF/µm$^2$ and the critical voltage of the insulation performance defined as $10^{-8}$ A/cm$^2$ was 1.2V. Although there are two capacitors in FIG. 9, even in the case of three or more capacitors, it is sufficient to form a protection film so as to cover the capacitors in a manner similar to the above.

Figure 10:
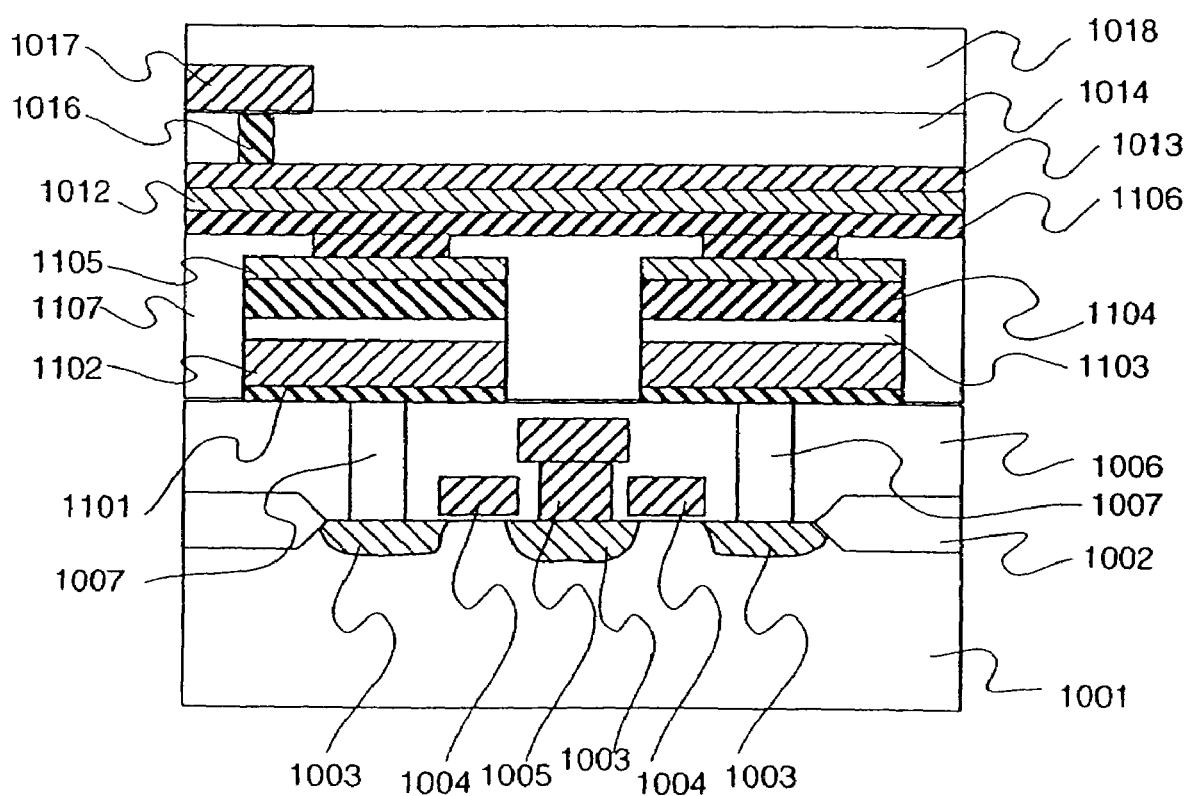
FIG. 10 is a partial cross section of a DRAM having a non-volatile operation mode according to the invention.

FIG. 10 illustrates an example of a DRAM having a non-volatile operating mode using PZT as a high dielectric constant or ferroelectric film. In a manner similar to the case of a BST-DRAM, the device layers including transistors are formed by a known method. Then, titanium nitride is deposited by reactive sputtering to 50 nm as a layer (1101) for preventing the reaction between a lower electrode (1102) and the conductive plug (1007). Subsequently, platinum serving as the lower electrode (1102) is deposited to 150 nm by DC sputtering and 50 nm of PZT is formed. In order to deposit PZT, sputtering, a sol-gel method, reactive deposition, and CVD can be applied. For example, it is preferable to perform the CVD by using an alcoholate or complex of lead, zirconium, and titanium and thermal decomposing it in oxygen. More preferably, a method using di-pyvaroyle methanate lead (Pb(DPM)$_2$), di-pyvaroyle methanate zirconium (Zr(DPM)$_4$), and titanium isopropoxide (Ti(i-OC$_3$H$_7$)$_4$) is effective. These materials are charged in a heat insulating vessel. Pb(DPM)$_2$ is heated to 100° C. to 150° C., Zr(DPM)$_4$ is heated to 150° C. to 200° C., and Ti(i-OC$_3$H$_7$)$_4$ is heated to 30° C. to 60° C. so as to have a proper steam pressure. The materials are transported into a reaction chamber by argon bubbling. With oxygen simultaneously supplied to the reaction chamber, the materials are thermal decomposed and oxidized on a substrate heated to 500° C. to 700° C. The thickness of the PZT film is set to 40 nm. Subsequently, platinum is deposited to 50 nm as a Schottky barrier layer (1104) by DC sputtering and tungsten serving as a hydrogen diffusion preventing layer (1105) is deposited to 100 nm by DC sputtering. After that, a pattern in the capacitor area is formed by a known photolithography technique and the capacitor is divided into bits by dry etching. Then, a capacitor protection film (1107) is formed by a known heat decomposition technique in the ozone atmosphere of tetra ethyloxy silane (TEOS) and etched back. Further, by a known photolithography technique, electrical contact holes to the capacitor are opened. On the film (1107), tungsten is deposited as a hydrogen diffusion preventing layer (1106) by sputtering while filling the electrical contact holes. Titanium nitride is deposited to 50 nm as a reaction preventing layer by reactive sputtering and, finally, silver is deposited to 50 nm as the adsorption inhibiting layer (1013). By the processes, the capacitor of the invention is formed on the device layer.

A wiring process after formation of the capacitor is similar to that of the BST-DRAM. At the time of formation of a tungsten connection plug (1016), in the case of the conventional aluminum/titanium/platinum stacked structure, a number of peelings occur in the interface of the Schottky barrier layer (1104) and the PZT (1103) and the structure is not practically used. On the other hand, in the case of using the structure of the invention, no peeling occurs and the degradation of a residual polarization is suppressed. The final residual polarization is 10 µC/cm$^2$ during operation at the source voltage of 3V. A non-residual polarization component was 20 µC/cm$^2$.

Embodiment 5

Figure 11:
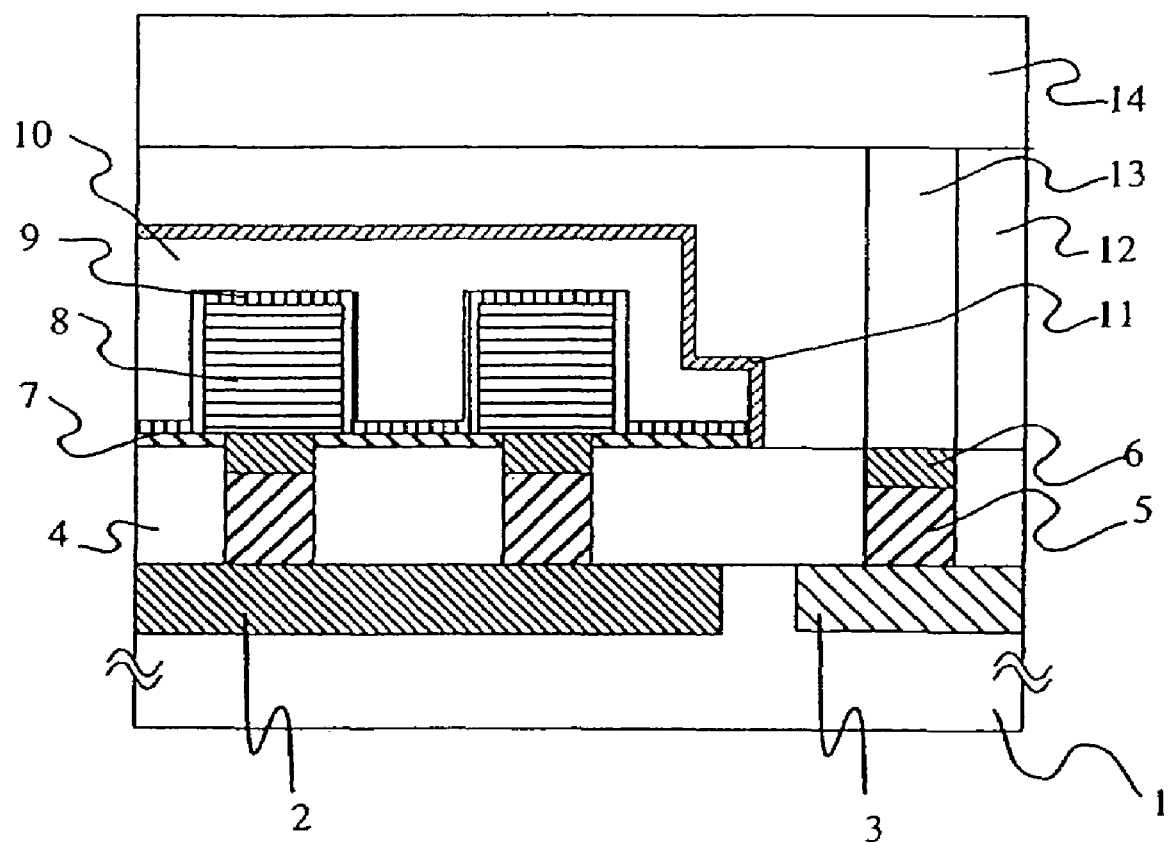
FIG. 11 is a cross section of a DRAM of an embodiment of the invention.

A preferred embodiment of the invention will be described with reference to FIG. 11. FIG. 11 relates to a case where the invention is applied to the DRAM. A memory cell transistor (2) and a peripheral transistor (3) are formed as semiconductor active devices on a silicon substrate (1). The memory cell transistor (2) is a semiconductor active device which is formed lower than a capacitor for storing information comprised of a lower electrode (8), a high dielectric constant or ferroelectric (9), and an upper electrode (10). The peripheral transistor (3) is a semiconductor active device formed separately from the capacitor area.

An interlayer insulating layer (4) is interposed between the capacitor layer and the transistor layer so as to electrically insulate the layers from each other. The capacitor layer and the transistor layer are electrically connected via plugs. Each plug is made up of two layers of a first plug (5) and a second plug (6). The second plug (6) is made of a conductive oxide whose degree of hydrogen diffusion is lower than that of the first plug (5). Between the interlayer insulating layer (4) and the capacitor layer, a hydrogen diffusion preventing layer (7) made of an insulating material having a degree of hydrogen diffusion lower than that of the interlayer insulating layer (4) is interposed. In the uppermost part of the upper electrode (10) of the capacitor layer, a hydrogen adsorption preventing layer (11) is provided. An interlayer insulating layer (12) insulated from an upper wiring layer (14) and a connection plug (13) are also provided.

Figure 12:
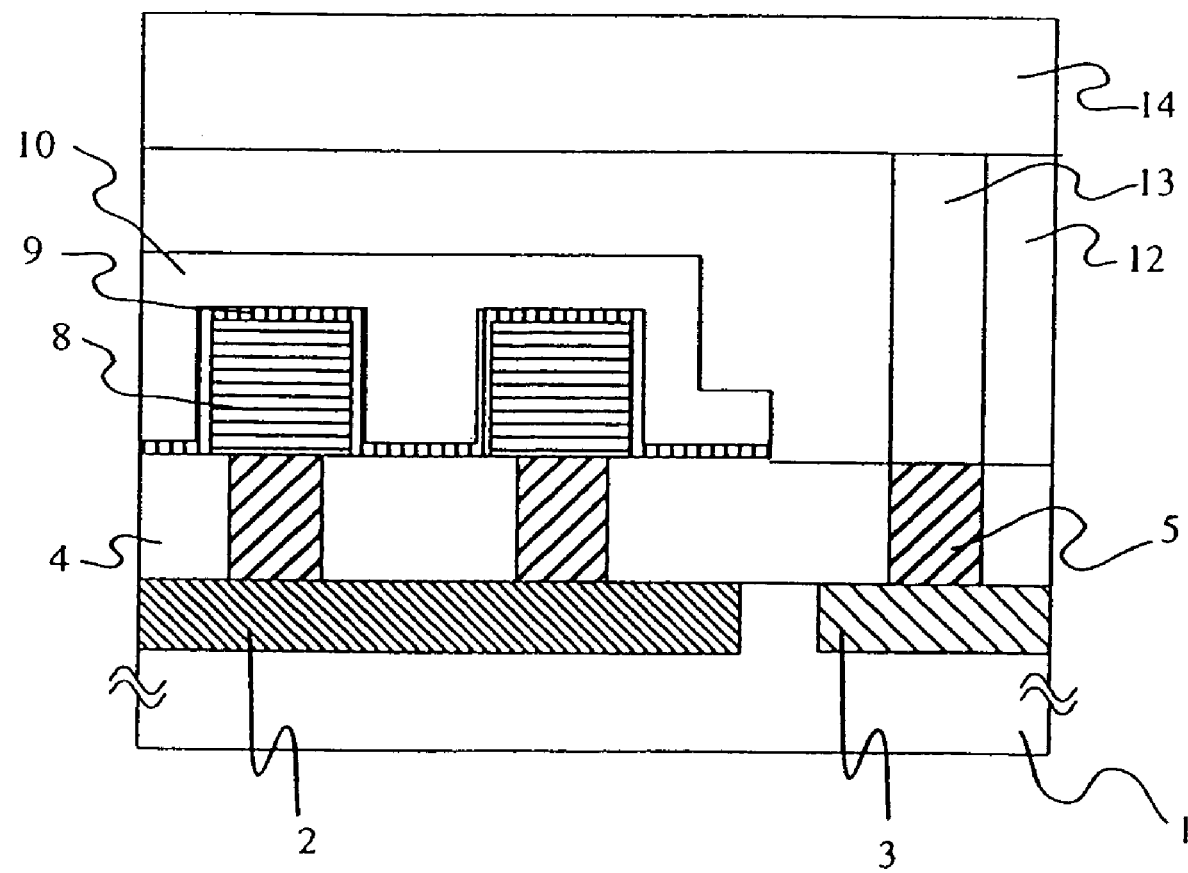
FIG. 12 is a cross section of a conventional DRAM.

The structure of a conventional DRAM is shown in FIG. 12. The point different from the conventional DRAM is that, in the DRAM (FIG. 11) of the invention, the capacitor is protected from reduction caused by hydrogen by the hydrogen adsorption preventing layer (11), the second plug (6) made of the conductive oxide, and the hydrogen diffusion preventing layer (7) made of an insulating material.

Figure 13:
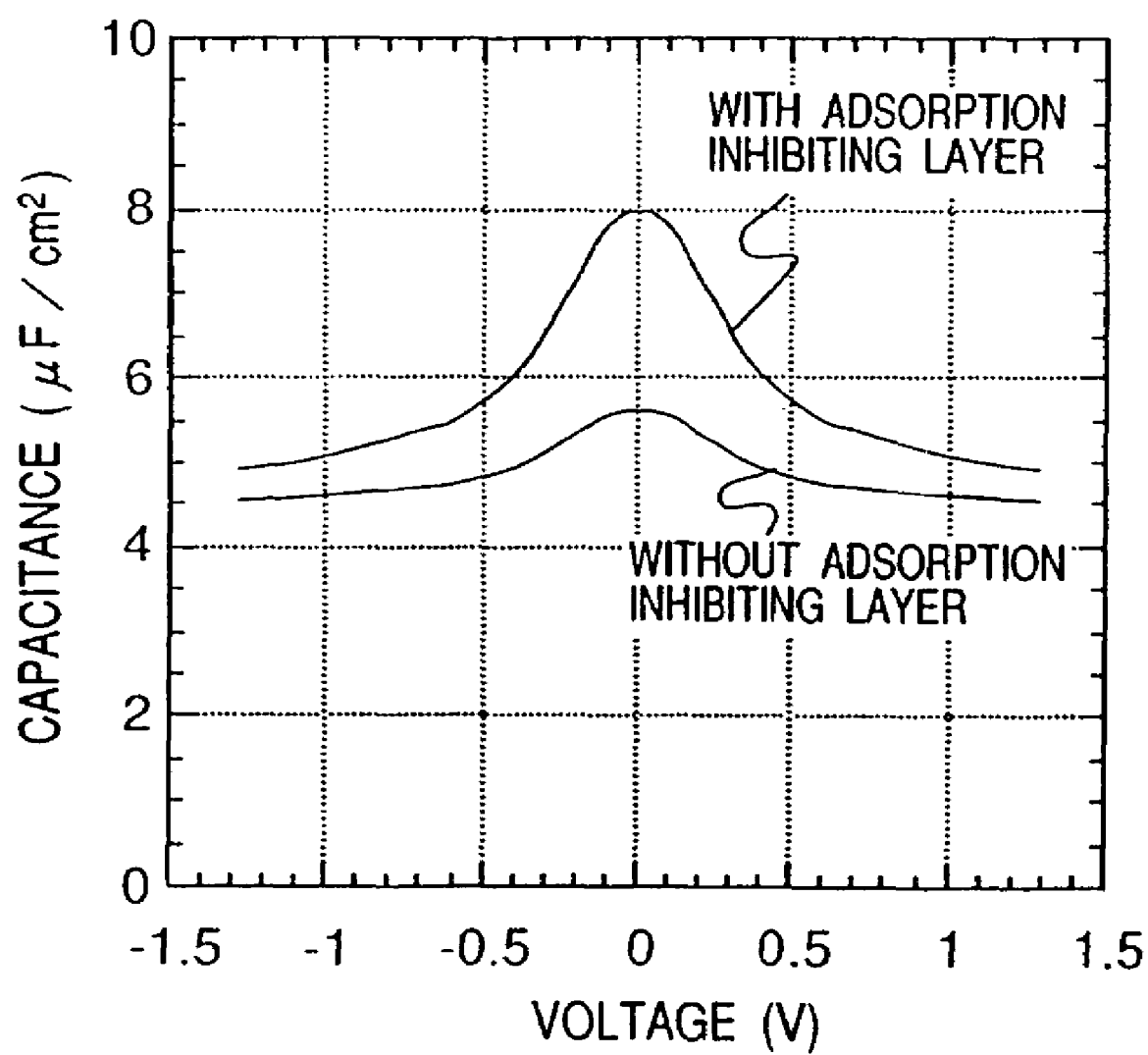
FIG. 13 is a diagram showing the comparison between the capacitance of a capacitor with a hydrogen adsorption and diffusion preventing layer and that of a capacitor without the layer.
Figure 14:
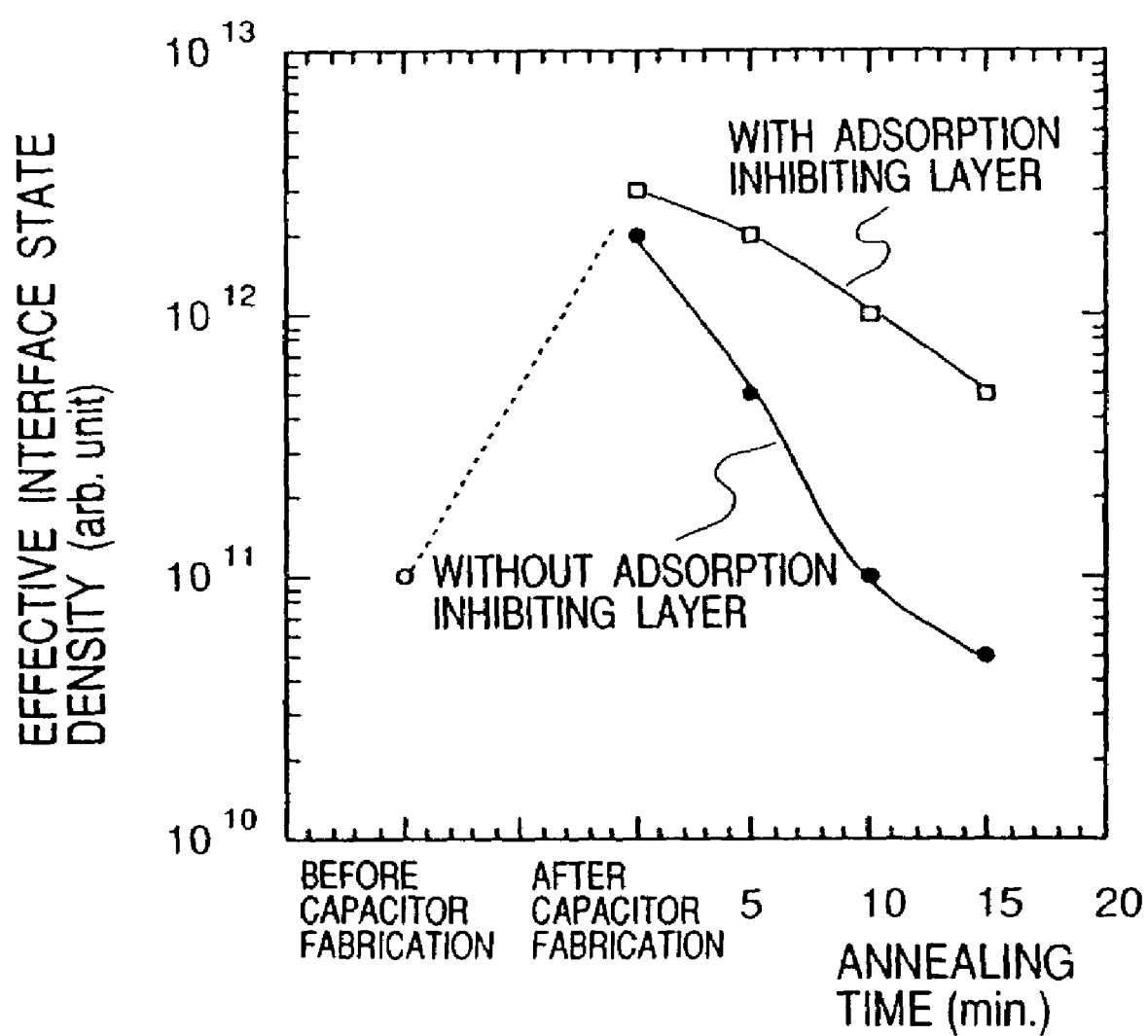
FIG. 14 is a diagram showing the comparison between an interface state density of a transistor with a hydrogen adsorption and diffusion preventing layer and that of a transistor without the layer.

The effects of the invention will now be described. The capacitor in the structure illustrated in FIG. 12 is very sensitive to damage caused by hydrogen. For example, when a hydrogen heat treatment at 350° C. for approximately ten minutes is performed, both of the dielectric constant and the electrical breakdown voltage largely decrease. On the contrary, when the hydrogen adsorption preventing layer which is the same as that shown in FIG. 11 is provided on the upper electrode, degradation of the dielectric constant and the electrical breakdown voltage is suppressed (FIG. 13). By providing the hydrogen adsorption preventing layer, however, as shown in FIG. 14, the interface state in the gate part of the transistor did not sufficiently recover even by the hydrogen heat treatment. This is because active hydrogen does not easily reach the gate part of the transistor. Especially, in the peripheral transistor, since the gain of the transistor is decreased, the ON current in the initial design cannot be assured. A problem such that access time of the storage device becomes longer consequently occurs.

Figure 15:
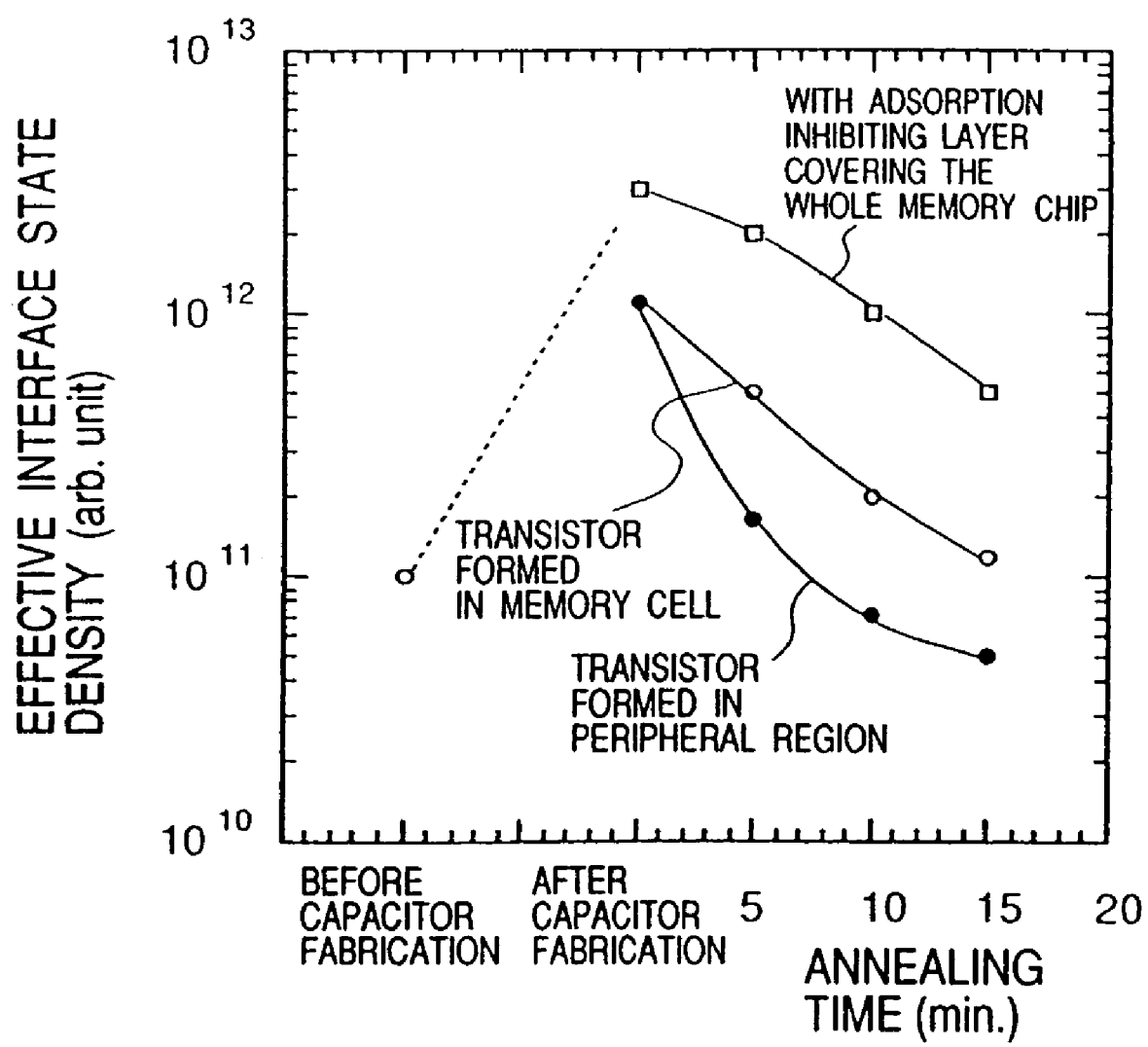
FIG. 15 is a diagram showing interface state densities of the transistor of the invention and the conventional transistor.

In contrast, according to the capacitor of the DRAM of the invention, the hydrogen adsorption inhibiting layer (11) in the uppermost part of the upper electrode is provided so as to cover only the memory cell transistor which demands a relatively low gain of the transistor. Further, by the functions of the second plug (6) and the hydrogen diffusion preventing layer (7) disposed under the capacitor, degradation of the capacitor caused by hydrogen diffused in the lateral direction is suppressed. As a result, as shown in FIG. 15, a sufficient hydrogen heat treatment can be applied so that the interface state density can be decreased in both of the memory cell transistor and the peripheral transistor. In FIG. 15, the curve with the hydrogen adsorption inhibiting layer shows the case where the hydrogen adsorption inhibiting layer is provided on both of the memory cell transistor and the peripheral transistor. Each of the curve of the memory cell transistor and the curve of the peripheral transistor indicates the effective interface state density of each transistor in the case where the hydrogen adsorption inhibiting layer is disposed on only the memory cell transistor.

Figure 16:
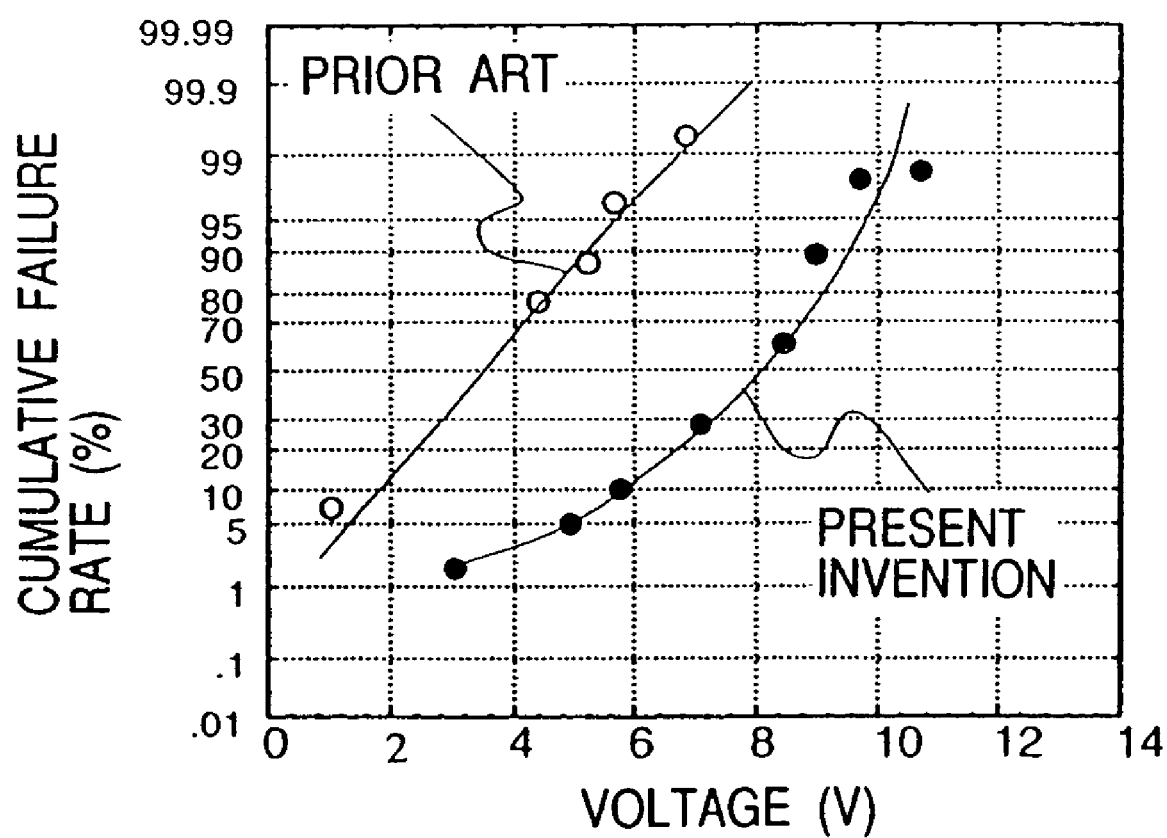
FIG. 16 is a diagram showing electrical breakdown characteristics of the capacitors of the transistor of the invention and the conventional transistor.

FIG. 16 shows the comparison between a change in the electrical breakdown voltage of the capacitor when the heat treatment was performed for thirty minutes in the case where the second plug (6) and the hydrogen diffusion preventing layer (7) are provided under the capacitor and that in the case where the second plug (6) and the hydrogen diffusion preventing layer (7) are not provided. It is understood that, in the prior art, degradation in the electrical breakdown voltage of the capacitor occurs due to the diffusion in the lateral direction and recovery of the characteristics of the transistor and holding of the characteristics of the capacitor have the trade-off relation. On the other hand, according to the invention, the degradation in the electrical breakdown voltage is suppressed within a memory applicable range and the trade-off can be avoided.

Embodiment 6

A method of fabricating the semiconductor device will now be described more specifically.

Figure 17:
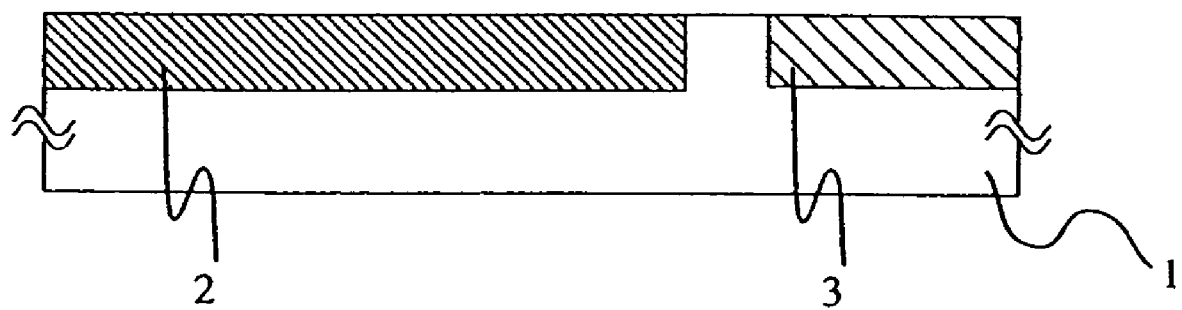
FIG. 17 is a diagram showing a process of fabricating a DRAM of an embodiment of the invention.
Figure 18:
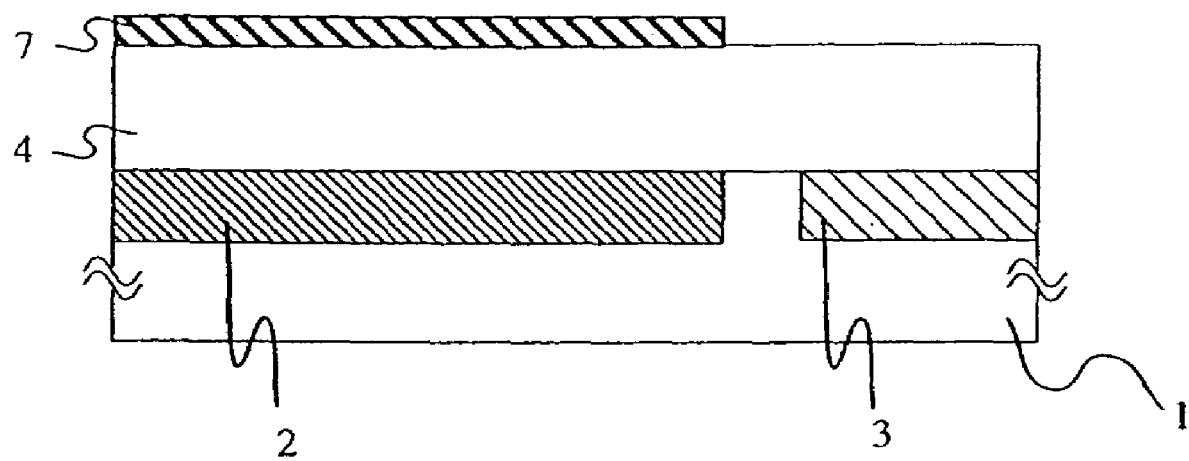
FIG. 18 is a diagram showing a process of fabricating the DRAM of the embodiment of the invention.

First, as illustrated in FIG. 17, the memory cell transistor (2) and the peripheral transistor (3) are formed by a known method on the silicon substrate (1). After the interlayer insulating layer (4) including wiring which interconnects transistors is formed, the hydrogen diffusion preventing layer (7) under the capacitor is formed. As the material, a material which suppresses diffusion of hydrogen more than the insulating film having $SiO_2$ as the main component which is usually used as an interlayer insulating layer, preferably, an aluminum oxide can be used. As another material, a cerium oxide can be mentioned. An $SiO_2$ oxide containing the above materials may be also used. The peripheral transistor part in the hydrogen diffusion inhibiting layer is removed after film formation (FIG. 18).

Figure 19:
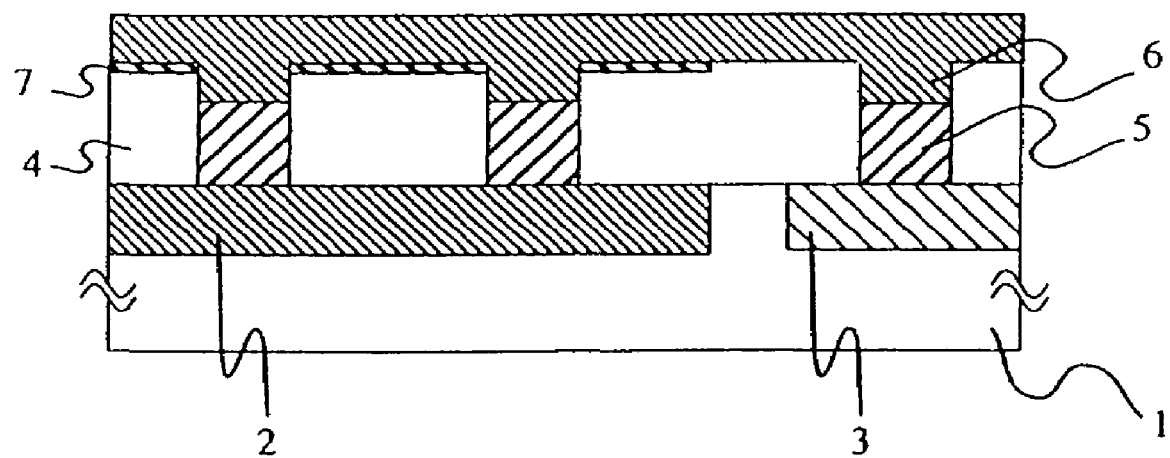
FIG. 19 is a diagram showing a process of fabricating the DRAM of the embodiment of the invention.

Subsequently, contact holes for plugs electrically connecting the capacitor to the memory cell transistor are opened by dry etching. Although the contact hole is opened also in the peripheral transistor part as necessary, this is selectively done according to the difficulty in processing of the contact hole of the connection plug (13) in FIG. 13 and is not related to the essence of the invention. Then, the contact hole is subjected to a plug embedding process. By CVD of excellent step coverage, preferably after formation of a layer of titanium nitride or polysilicon, the first plug (5) is formed first by etch back. Subsequently, the second plug (6) as a conductive hydrogen diffusion inhibiting layer is formed on the whole surface. Iridium oxide is used here. As other preferable materials, ruthenium oxide, osmium oxide, platinum oxide, or a mixture of them can be mentioned (FIG. 19).

Figure 20:
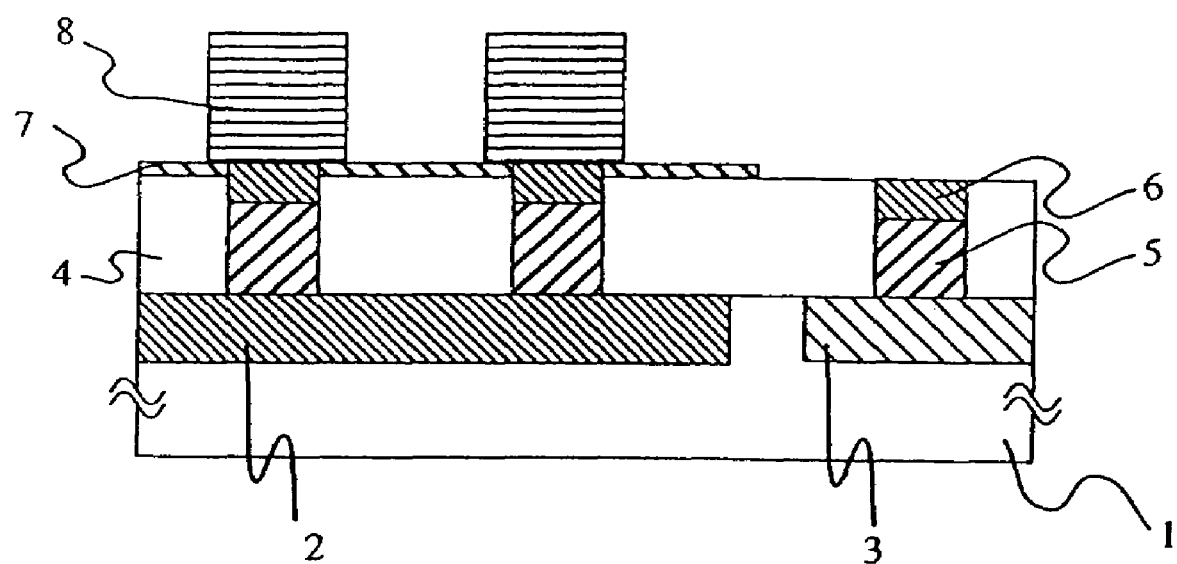
FIG. 20 is a diagram showing a process of fabricating the DRAM of the embodiment of the invention.

The hydrogen diffusion preventing layer formed on the whole surface is removed except for the plug parts by etch back or chemical-mechanical polishing. After that, the lower electrodes (8) are formed. Although platinum is used as the material of the lower electrode here, ruthenium, iridium, osmium, rhenium, and a conductive material having the material selected from oxides of those materials as the main component are suitable. Any of the materials is deposited to 150 nm by sputtering and, after that, the film is divided into memory elements, thereby obtaining the lower electrode structure (FIG. 20).

BST is then deposited as a high dielectric constant or ferroelectric (9) by CVD so as to have the thickness of 30 nm. BST is formed by introducing di-pyvaroyle methanate barium $(Ba(DPM)_2)$, di-pyvaroyle methanate strontium $(Sr(DPM)_3)$, and titanium isopropoxide $(Ti(I-OC_3H_7)_4)$ into a reactive chamber by bubbling and thermal decomposing the materials in an oxidizing atmosphere. As the material of the CVD, besides the above materials, a known complex or alkoxide can be used. For introduction of the materials, a method using determination of liquid materials and a carburetor may be also used. As a method of decomposition, besides the heat decomposition, plasma assist can be used. After formation of the BST film, a heat treatment is performed in oxygen or nitrogen as necessary.

Subsequently, as the upper electrode (10), Ru is deposited to have the thickness of 100 nm by CVD. As the material of the upper electrode, the materials used for the lower electrode, that is, platinum, iridium, osmium, rhenium, and a conductive material having the material selected from oxides of those materials as the main component are suitable. In this case, a ruthenium thin film serving as an upper electrode is formed by thermal decomposition CVD in the oxygen atmosphere using ruthenocene as a row material. After formation of the upper electrode, a heat treatment is carried out in oxygen or nitrogen as necessary.

Figure 21:
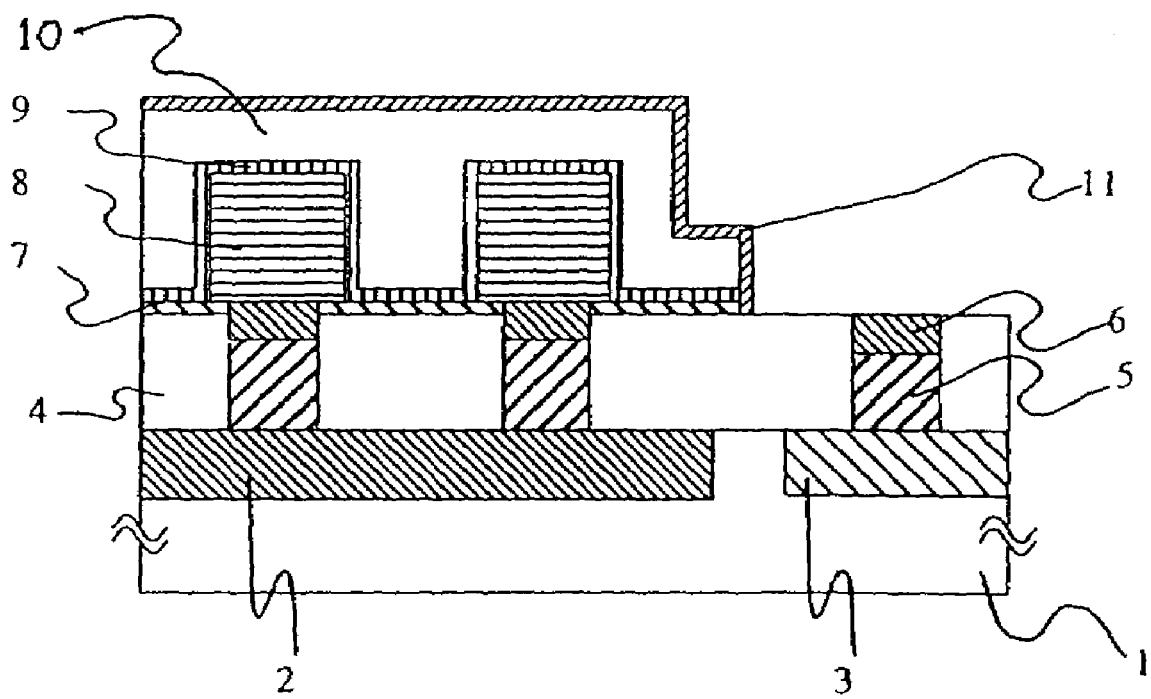
FIG. 21 is a diagram showing a process of fabricating the DRAM of the embodiment of the invention.

The upper electrode/BST stacked film is processed by dry etching so as to leave the memory cell part and the adsorption inhibiting layer (11) is formed by the CVD. Aluminum is used as a material having low hydrogen adsorptivity and diffusivity. It is sufficient to use the material having the hydrogen adsorptivity and diffusivity lower than those of the upper electrode (10) and the lower electrode (8) for the adsorption and diffusion inhibiting layer (11). As examples, there are gold, silver, aluminum, silicon, silver, zinc, cadmium, indium, germanium, tin, lead, and bismuth. Especially, aluminum, silicon, and lead are suitable. The film is removed except for the memory cell transistor parts by the dry etching, thereby obtaining the structure shown in FIG. 21.

After that, the interlayer insulating film (12) is formed by the CVD. As described above, due to the actions of the adsorption inhibiting layer (11), the hydrogen diffusion preventing layer (7), and the second plug (6), known plasma CVD or thermal CVD can be used as CVD. In the case where there is no adsorption inhibiting layer (11), capacitance reduction, electrical breakdown voltage degradation, and electrode peeling of the capacitor occur at this time point, so that a memory cannot be produced. For the interlayer insulating film (12), the wiring layer (14) and the connection plug (13) for electrically connecting the wiring layer (14) to the transistor are formed, thereby obtaining the structure illustrated in FIG. 21. Especially, as an effect of the invention, it can be mentioned that the connection plug (13) can be formed by selective CVD using a silane gas and hexafluoride tungsten. By performing hydrogen annealing in the state of FIG. 21, the characteristics of the memory cell transistor (2) and the peripheral transistor (3) are repaired. The parameters are such that the hydrogen annealing is performed in 3% hydrogen atmosphere at 400° C. for thirty minutes. In this case as well, as mentioned above, degradations as shown in FIGS. 13 to 15 occur and the memory operation cannot be executed in the conventional structure. As an example of the high dielectric constant or ferroelectric material, BST has been mentioned. With strontium titanate ($SrTiO_3$) as well, almost similar effects are obtained. Except for this, an oxide high dielectric constant or ferroelectric material having, as the main component, an element selected from barium, lead, strontium, and bismuth is effective. Especially, when any of PZT, lead titanate ($PbTiO_3$), barium lead zirconate titanate ($(Ba, Pb)(Zr, Ti)O_3$), barium lead niobate ($(Ba, Pb)Nb_2O_6$), strontium bismuth tantalate ($SrBi_2Ta_2O_9$), and bismuth titanate ($Bi_4Ti_3O_{12}$) is used, a memory having a non-volatile function can be formed.

The final capacitance of the capacitor using BST is 6.5 $\mu F/cm^2$ (in the event of operation at the source voltage of 2.2V) and an average electrical breakdown voltage is 3V.

INDUSTRIAL APPLICABILITY

The present invention is applied to a memory device having a storage capacitor, for example, a dynamic random access memory or the like.

What is claimed is:
1. A semiconductor storage device comprising:
a storage capacity part having a first electrode comprised of platinum, a high dielectric constant or ferroelectric film which is provided in contact with the first electrode, and a second electrode provided in contact with the high dielectric constant or ferroelectric film;
a hydrogen diffusion preventing layer provided on the storage capacity part; and
an adsorption inhibiting layer provided on the hydrogen diffusion preventing layer,
wherein a reaction preventing layer is provided between the hydrogen diffusion preventing layer and the adsorption inhibiting layer.
2. A semiconductor storage device according to claim 1, wherein said second electrode is comprised of platinum.
3. A semiconductor storage device according to claim 2, wherein said first electrode is a lower electrode and said second electrode is an upper electrode.
4. A semiconductor storage device according to claim 1, characterized in that the reaction preventing layer is made of any of titanium, tungsten, tantalum, molybdenum, or any alloy or nitride of any of these materials.
5. A semiconductor storage device according to claim 1, wherein the hydrogen diffusion preventing layer or the adsorption inhibiting layer is made of a conductive oxide.
6. A semiconductor storage device according to claim 1, wherein said first electrode is a lower electrode and said second electrode is an upper electrode.
7. A semiconductor storage device comprising:
a storage capacity part having a first electrode comprised of platinum, a high dielectric constant or ferroelectric film which is provided in contact with the first electrode, and a second electrode provided in contact with the high dielectric constant or ferroelectric film;
a hydrogen diffusion preventing layer provided on the storage capacity part;
and an adsorption inhibiting layer provided so as to substantially completely cover the hydrogen diffusion preventing layer,
wherein the adsorption inhibiting layer is a layer made of any of silver, aluminum, silicon, lead, bismuth, gold, zinc, cadmium, indium, germanium, and tin.
8. A semiconductor storage device according to claim 7, wherein said second electrode is comprised of platinum.
9. A semiconductor storage device according to claim 8, wherein said first electrode is a lower electrode and said second electrode is an upper electrode.
10. A semiconductor storage device according to claim 7, wherein said first electrode is a lower electrode and said second electrode is an upper electrode.
11. A semiconductor device comprising:
an active device;
a capacitor having a first electrode comprised of platinum, a second electrode, and a high dielectric constant or ferroelectric film provided between the first and second electrodes;
an adsorption inhibiting layer provided so as to substantially completely cover the hydrogen diffusion preventing layer,
a hydrogen diffusion preventing layer formed between the active device and the capacitor,
wherein the adsorption inhibiting layer constructs a part of the second electrode.
12. A semiconductor storage device according to claim 11, wherein said second electrode is comprised of platinum.
13. A semiconductor storage device according to claim 12, wherein said first electrode is a lower electrode and said second electrode is an upper electrode.
14. A semiconductor storage device according to claim 11, wherein said first electrode is a lower electrode and said second electrode is an upper electrode.
15. A semiconductor storage device comprising:
a capacitor having a first electrode comprised of platinum, a high dielectric constant or ferroelectric film which is provided in contact with the first electrode, and a second electrode provided in contact with the high dielectric constant or ferroelectric film;

16. A semiconductor storage device according to claim 15, wherein said second electrode is comprised of platinum.

17. A semiconductor storage device according to claim 16, wherein said first electrode is a lower electrode and said second electrode is an upper electrode.

18. A semiconductor storage device according to claim 15, characterized in that the hydrogen diffusion preventing layer is a layer comprised of any titanium, tungsten, tantalum, molybdenum, an alloy or nitride of any of these materials, tungsten, ruthenium, iridium, palladium, osmium, ruthenium oxide, iridium oxide, palladium oxide osmium oxide, platinum oxide, and an oxide of an alloy of any of tungsten, ruthenium, iridium, palladium, and osmium.

19. A semiconductor storage device according to claim 15, characterized in that the hydrogen adsorption inhibiting layer is a part of the second electrode.

20. A semiconductor storage device according to claim 15, wherein said first electrode is a lower electrode and said second electrode is an upper electrode.

21. A semiconductor storage device comprising:
a capacitor having a first electrode comprised of platinum, a high dielectric constant or ferroelectric film which is provided in contact with the first electrode, and a second electrode provided in contact with the high dielectric constant or ferroelectric film;
a hydrogen diffusion preventing layer provided on the capacitor part; and
a hydrogen adsorption inhibiting layer provided on the hydrogen diffusion preventing layer,
wherein the hydrogen adsorption inhibiting layer is comprised of any one of silver, aluminum, lead, bismuth, gold, zinc, cadmium, indium, germanium and tin,
characterized in that a reaction preventing layer is provided between the hydrogen diffusion preventing layer and the adsorption inhibiting layer,
wherein the reaction preventing layer is comprised of any one of titanium, tungsten, tantalum, molybdenum or an alloy or nitride of any of these materials.

* * * * *